(12) United States Patent
Umeda et al.

(10) Patent No.: US 7,649,304 B2
(45) Date of Patent: Jan. 19, 2010

(54) PIEZOELECTRIC RESONATOR AND PIEZOELECTRIC FILTER

(75) Inventors: Keiichi Umeda, Omihachiman (JP); Takashi Miyake, Hakusan (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/211,865

(22) Filed: Sep. 17, 2008

(65) Prior Publication Data
US 2009/0001848 A1  Jan. 1, 2009

Related U.S. Application Data

(63) Continuation of application No. PCT/JP2007/056612, filed on Mar. 28, 2007.

(30) Foreign Application Priority Data

Apr. 5, 2006  (JP) .............................. 2006-104195

(51) Int. Cl.
*H01L 41/08* (2006.01)
*H03H 9/25* (2006.01)
(52) U.S. Cl. .................. 310/320; 310/312; 333/187
(58) Field of Classification Search ................ 310/312, 310/320, 324, 349, 364–365; 333/187–195
See application file for complete search history.

(56) References Cited

U.S. PATENT DOCUMENTS

| 5,872,493 | A | * | 2/1999 | Ella | 333/191 |
| 6,469,597 | B2 | | 10/2002 | Ruby et al. | |
| 6,483,229 | B2 | * | 11/2002 | Larson et al. | 310/348 |
| 6,954,121 | B2 | * | 10/2005 | Bradley et al. | 333/187 |
| 2002/0014808 | A1 | | 2/2002 | Misu et al. | |
| 2002/0123177 | A1 | | 9/2002 | Ruby et al. | |
| 2004/0195937 | A1 | | 10/2004 | Matsubara et al. | |
| 2007/0194863 | A1 | * | 8/2007 | Shibata et al. | 333/187 |

FOREIGN PATENT DOCUMENTS

| JP | 2006-13839 A | | 1/2006 |
| WO | WO 9937023 A1 | * | 7/1999 |

OTHER PUBLICATIONS

Official Communication issued in International Patent Application No. PCT/JP2007/056612, mailed on Jul. 24, 2007.

* cited by examiner

*Primary Examiner*—J. SanMartin
(74) *Attorney, Agent, or Firm*—Keating & Bennett, LLP

(57) ABSTRACT

A piezoelectric resonator includes a laminated thin film having a first thin film portion supported by a substrate and a second thin film portion spaced apart from a first main surface of the substrate and acoustically isolated from the substrate. The second thin film portion of the laminated thin film includes a piezoelectric thin film, a first electrode disposed on the upper surface of the piezoelectric thin film, and a second electrode disposed on the lower surface of the piezoelectric thin film and being larger and thicker than the first electrode. The piezoelectric resonator further includes a mass adding film disposed around the first electrode and on at least one portion of a region extending outward from the periphery of a piezoelectric vibrating portion at which the first and second electrodes overlap each other with the piezoelectric thin film disposed therebetween. The second electrode arranged so as to extend beyond the piezoelectric vibrating portion to a region at which the mass adding film is disposed.

8 Claims, 19 Drawing Sheets

PIEZOELECTRIC RESONATOR AND PIEZOELECTRIC FILTER

BACKGROUND OF THE INVENTION

1. Field of the Invention

The present invention relates to a piezoelectric resonator and a piezoelectric filter including a piezoelectric thin film, and more specifically, to a piezoelectric resonator and a piezoelectric filter in which a piezoelectric vibrating portion including a piezoelectric thin film is arranged while being separated from a substrate.

2. Description of the Related Art

Known piezoelectric resonators and piezoelectric filters include a thin piezoelectric vibrating portion including a piezoelectric thin film.

For example, Japanese Unexamined Patent Application Publication No. 2002-299980 discloses a piezoelectric filter illustrated in FIG. 37. A piezoelectric filter 501 includes recesses 502a and 502b provided on the upper surface of a support substrate 502. In a region in which the recess 502a is provided, a first piezoelectric resonator 506 including a piezoelectric thin film 503, an upper electrode 504, and a lower electrode 505 is arranged above the recess 502a.

Similarly, a piezoelectric resonator 509 including the piezoelectric thin film 503, an upper electrode 507, and a lower electrode 508 is also arranged above the recess 502b.

Here, the piezoelectric resonators 506 and 509 are electrically connected to each other such that the piezoelectric resonator 506 is a series arm resonator and the piezoelectric resonator 509 is a parallel arm resonator, and the piezoelectric filter 501 having a ladder circuit configuration is provided. To provide a difference between the resonant frequency of the series arm resonator and that of the parallel arm resonator, the lower electrode 505 of the piezoelectric resonator 506 and the lower electrode 508 of the other piezoelectric resonator 509 have different thicknesses.

WO99/37023 discloses an energy-trap piezoelectric resonator utilizing the thickness longitudinal vibration mode. In this piezoelectric resonator, in the portion in which an upper electrode and a lower electrode overlap each other with a piezoelectric substrate disposed therebetween, an energy-trap piezoelectric vibrating portion utilizing the thickness longitudinal vibration mode is provided. A mass adding film is disposed at the outer area of either the upper electrode or the lower electrode. The mass adding film adds mass to the surrounding area of the piezoelectric vibrating portion. This enables the thickness longitudinal vibration mode to be effectively trapped in the piezoelectric vibrating portion.

The piezoelectric filter 501 described in Japanese Unexamined Patent Application Publication No. 2002-299980 includes the piezoelectric thin film 503 having a relatively small thickness. Therefore, as compared to when a piezoelectric plate having a relatively large thickness is used, the resonant frequency of each of the piezoelectric resonators 506 and 509 can be increased. That is, the piezoelectric filter 501 capable of being used in a higher frequency range can be provided by utilizing the thickness longitudinal vibration mode.

However, a spurious component caused by another mode, such as a Lamb wave propagating in the direction of the plane of the piezoelectric thin film 503, other than the thickness longitudinal vibration mode, may occur, and favorable resonant characteristics and filter characteristics may not be obtained.

SUMMARY OF THE INVENTION

To overcome the problems described above, preferred embodiments of the present invention provide a piezoelectric resonator and a piezoelectric filter in which deterioration in the characteristics thereof caused a spurious component propagating in the direction of the plane of a piezoelectric thin film is prevented. The piezoelectric resonator and the piezoelectric filter include a relatively thin piezoelectric thin film, which enables the piezoelectric resonator and the piezoelectric filter to operate in a higher frequency range.

According to a preferred embodiment of the present invention, a piezoelectric resonator includes a substrate including first and second main surfaces and a laminated thin film including a first thin film portion and a second thin film portion. The first thin film portion is disposed on the first main surface of the substrate and supported by the substrate. The second thin film portion is spaced apart from the first main surface of the substrate and acoustically isolated from the substrate. The second thin film portion of the laminated thin film includes a piezoelectric thin film, a first electrode disposed on one main surface of the piezoelectric thin film, and a second electrode disposed on another main surface of the piezoelectric thin film and being larger than the first electrode, and a portion at which the first and second electrodes overlap each other with the piezoelectric thin film disposed therebetween defines a piezoelectric vibrating portion. The piezoelectric resonator further includes a mass adding film disposed around the first electrode and on at least one portion of an outer region extending outward from a periphery of the piezoelectric vibrating portion. The second electrode is arranged so as to extend beyond the piezoelectric vibrating portion to a region at which the mass adding film is disposed.

The piezoelectric resonator according to a preferred embodiment of the present invention preferably further includes a step forming film disposed on the first electrode and disposed within the periphery of the piezoelectric vibrating portion with a gap therebetween. Because an outer edge of the step forming film on the piezoelectric vibrating portion provides a step, a spurious component occurring in a frequency range less than the resonant frequency is suppressed.

In the piezoelectric resonator according to another preferred embodiment of the present invention, the first electrode and the second electrode may preferably have different film thicknesses. Either the first electrode or the second electrode may have a greater film thickness. In another preferred embodiment of the present invention, the second electrode may have a film thickness greater than that of the first electrode. That is, in a plane having no mass adding film, a mass adding effect may be provided by the second electrode. Therefore, because mass is added from both surfaces, a spurious component caused by vibration occurring along the direction of the plane of the piezoelectric thin film can be effectively suppressed.

In a piezoelectric filter according to a preferred embodiment of the present invention, a plurality of piezoelectric resonators are provided on the same substrate, and the plurality of piezoelectric resonators are electrically connected to each other to define a filter circuit. Therefore, because each piezoelectric resonator is fabricated using the piezoelectric thin film, the piezoelectric filter can be used in a higher frequency range and can have a reduced thickness. In addition, according to preferred embodiments of the present invention, because the mass adding film is provided around the first electrode and the second electrode is larger, a spurious component can be effectively suppressed by the mass adding effect produced by the mass adding film and the second electrode. Therefore, favorable filter characteristics can be obtained.

In the piezoelectric filter according to a preferred embodiment of the present invention, at least one piezoelectric resonator of the plurality of piezoelectric resonators may preferably be configured differently from the other piezoelectric resonators. Therefore, various filter characteristics can be obtained by combining resonant characteristics of piezoelectric resonators having different characteristics.

In the piezoelectric filter according to another preferred embodiment of the present invention, the second electrode of the at least one piezoelectric resonator may preferably have a film thickness that is different from that of the second electrode of each of the other piezoelectric resonators, thereby causing a resonant frequency of the at least one piezoelectric resonator to differ from a resonant frequency of each of the other piezoelectric resonators. Therefore, a ladder filter can be provided by using one of at least two kinds of piezoelectric resonators including second electrodes having different thicknesses as, for example, a series arm resonator and the other as, for example, a parallel arm resonator. In addition to such a ladder circuit, various filters can be provided by connecting at least two kinds of piezoelectric resonators having different resonant frequencies described above. Thus, various filter characteristics can be obtained.

In the piezoelectric filter according to still another preferred embodiment of the present invention, in the at least one piezoelectric resonator of the plurality of piezoelectric resonators, the first electrode and the second electrode may preferably have different film thicknesses. That is, the film thickness of the first electrode and that of the second electrode may be different from one another.

In the piezoelectric filter according to yet another preferred embodiment of the present invention, in the at least one piezoelectric resonator of the plurality of piezoelectric resonators, the second electrode may preferably have a film thickness greater than that of the first electrode. In this case, the mass adding function provided by the second electrode can be increased due to its greater film thickness, such that a spurious component can be suppressed more effectively.

In the piezoelectric resonator according to a preferred embodiment of the present invention, the energy-trap piezoelectric vibrating portion is provided. Therefore, because the piezoelectric vibrating portion includes the relatively thin piezoelectric thin film, the piezoelectric resonator can have a reduced thickness and can be used in a higher frequency range. Additionally, the mass adding film is disposed around the first electrode having a smaller size, and mass is added to the surrounding area of the piezoelectric vibrating portion by the mass adding film. On the other hand, the second electrode is larger than the first electrode, and is arranged to extend beyond the piezoelectric vibrating portion to a region in which the mass adding film is disposed. Therefore, mass is added to the piezoelectric thin film by both the mass adding film and the second electrode portion facing the mass adding film. Accordingly, a spurious component caused by vibration propagating in the direction of the plane of the piezoelectric thin film can be effectively suppressed, such that favorable resonant characteristics having a significantly reduced spurious component are obtained.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described below with reference to the drawings.

Figure 1:
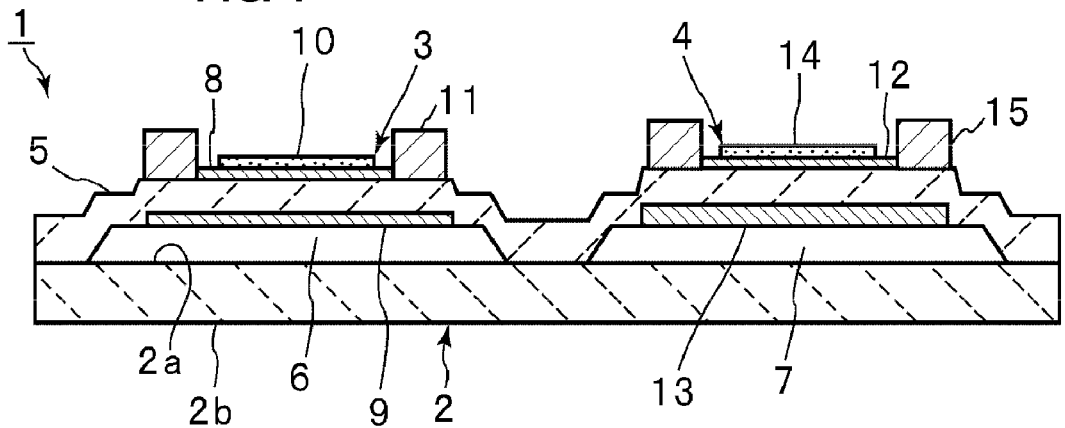
FIG. 1 is a schematic front cross-sectional view of a piezoelectric filter according to a first preferred embodiment of the present invention.

FIG. 1 is a front cross-sectional view of a piezoelectric filter according to a first preferred embodiment of the present invention. A piezoelectric filter 1 includes a substrate 2. The substrate 2 includes an upper first main surface 2a and a lower second main surface 2b. The substrate 2 supports a piezoelectric resonator described below. Thus, the substrate 2 can be made of an insulating material, such as suitable insulating ceramics or insulating resin, for example.

In the present preferred embodiment, the substrate 2 is preferably composed of a Si-based substrate, for example.

Piezoelectric resonators 3 and 4 are arranged above the upper surface 2a of the substrate 2. Each of the piezoelectric resonators 3 and 4 is a piezoelectric thin-film resonator including a piezoelectric thin film described below.

That is, a piezoelectric thin film 5 is arranged above the upper surface 2a of the substrate 2. In the portion in which the piezoelectric resonators 3 and 4 are provided, the piezoelectric thin film 5 is spaced apart from and disposed above the upper surface 2a with cavities 6 and 7 disposed therebetween.

The piezoelectric thin film 5 is disposed on the upper surface 2a of the substrate 2 around the portion in which the cavities 6 and 7 are provided.

In the portion in which the piezoelectric resonator 3 is disposed, an upper electrode 8 is arranged on an upper surface of the piezoelectric thin film 5, and a lower electrode 9 is arranged on a lower surface of the piezoelectric thin film 5 so as to overlap the upper electrode 8 with the piezoelectric thin film 5 disposed therebetween. The lower electrode 9 is larger than the upper electrode 8. The upper electrode 8 corresponds to a first electrode in preferred embodiments of the present invention, and the lower electrode 9 corresponds to a second electrode. In the piezoelectric resonator 3, the upper electrode 8 and the lower electrode 9 are laminated on the top and the bottom of the piezoelectric thin film 5, respectively. Such a laminated thin film defines the piezoelectric resonator 3 and the piezoelectric resonator 4.

The laminated thin film includes a first thin-film portion fixed on the upper surface 2a of the substrate 2 and a second thin-film portion. The second thin-film portion is spaced away from and acoustically isolated from the upper surface 2a of the substrate 2. This second thin-film portion defines the piezoelectric resonator 3 and the piezoelectric resonator 4.

The second thin-film portion, in which the upper electrode 8 and the lower electrode 9 overlap each other with the piezoelectric thin film 5 disposed therebetween, defines a piezoelectric vibrating portion. In the present preferred embodiment, the piezoelectric thin film 5 is made of aluminum nitride (AlN), and the direction of the polarization axis thereof is the thickness direction. Therefore, resonant characteristics utilizing the thickness longitudinal vibration mode are obtained by the applying an alternating voltage from the upper electrode 8 and the lower electrode 9. In this case, the portion in which the upper electrode 8 and the lower electrode 9 overlap each other with the piezoelectric thin film 5 disposed therebetween is an energy-trap piezoelectric vibrating portion driven by applying the alternating voltage. The piezoelectric vibrating portion is preferably defined by the piezoelectric thin film 5 having a thickness in the range of about 0.1 µm to about 10 µm, for example. That is, because the piezoelectric resonator is defined by a laminated thin film, the piezoelectric resonator can be used in a higher frequency range, as compared to a piezoelectric resonator including a piezoelectric substrate that is greater than about 10 µm and utilizing the thickness longitudinal vibration mode.

Each of the upper electrode 8 and the lower electrode 9 is made of a suitable conductive material. In the present preferred embodiment, the upper electrode 8 is preferably made of a laminated metallic film including an Al electrode layer as the main layer and an electrode layer made of titanium (Ti) as the primer layer laminated below the Al electrode layer, for example.

In the present preferred embodiment, the lower electrode 9 preferably includes Pt, Ti, Al, and Ti layers that are laminated together, for example. In this case, the lower electrode 9 is arranged such that the Pt layer is the outermost layer.

That is, the lower electrode 9 includes the Al layer as the primary portion, the Ti layers arranged on both surfaces of the Al layer, and the Pt layer arranged as the outermost layer.

In the piezoelectric vibrating portion, a frequency adjustment film 10 is disposed above the upper electrode 8. The frequency adjustment film 10 is provided to add mass on the upper electrode 8 and to adjust the resonant frequency in the piezoelectric vibrating portion. The frequency adjustment film 10 is not necessarily provided.

It is noted that utilizing the mass adding function provided by the frequency adjustment film 10, that is, selecting the thickness or material of the frequency adjustment film 10, enables the resonant frequency of the piezoelectric resonator 3 to be precisely adjusted to a desired resonant frequency.

Additionally, in the present preferred embodiment, the frequency adjustment film 10 is arranged within the perimeter of the upper electrode 8 as the first electrode with a gap provided therebetween. The outer edge of this frequency adjustment film defines a step above the piezoelectric vibrating portion. That is, a step provided by the outer edge of the frequency adjustment film 10 is provided between the upper surface of the upper electrode 8 and the upper surface of the frequency adjustment film 10. Due to the step, a spurious component in a frequency range below the resonant frequency is reduced. In other words, in preferred embodiments of the present invention, the frequency adjustment film 10 also functions as a step forming film to reduce the spurious component.

Preferably, the size of the step may be adjusted by reducing the thickness of a portion adjacent to the outer edge of the frequency adjustment film 10, for example, so that the spurious component can be more effectively reduced. In this case, improved filter characteristics can be obtained.

In the present preferred embodiment, the frequency adjustment film 10 is preferably made of silicon dioxide (SiO$_2$), for example. Preferably, the frequency adjustment film 10 may be made of the same material as a mass adding film 11, which is described below. In this case, the number of materials to be prepared can be reduced.

In the region outside the piezoelectric vibrating portion, the mass adding film 11 is arranged on the upper surface of the piezoelectric thin film 5. The mass adding film 11 is disposed on a portion of an outer region adjacent to the periphery of the piezoelectric vibrating portion. In the present preferred embodiment, the mass adding film 11 has a substantially annular shape so as to surround the outer edge of the piezoelectric vibrating portion. The mass adding film 11 enables a spurious component of the utilized thickness longitudinal vibration mode to be effectively reduced.

The material of the mass adding film 11 is not particularly limited. In the present preferred embodiment, the mass adding film 11 is preferably made of SiO$_2$, for example.

In the present preferred embodiment, the lower electrode 9 defining the second electrode extends to a region disposed under the region in which the mass adding film 11 is disposed. In other words, the second electrode 9 extends to a region outside the piezoelectric vibrating portion and extends beyond the piezoelectric vibrating portion to the region in which the mass adding film 11 is disposed. Because the lower electrode 9 extends to the region in which the mass adding film 11 is disposed outside the piezoelectric vibrating portion, in the present preferred embodiment, the spurious component can also be effectively reduced by the mass adding function of the lower electrode 9 in the portion in which the lower electrode 9 extends to the region in which the mass adding film 11 is disposed. The effect of the mass adding function produced by the mass adding film 11 and the lower electrode 9 is described below based on experimental examples.

In the piezoelectric resonator 4, similar to the piezoelectric resonator 3, an upper electrode 12 is disposed on the upper surface of the piezoelectric thin film 5, and a lower electrode 13 is disposed on the lower surface thereof. The lower electrode 13 defining the second electrode is larger than the upper electrode 12 defining the first electrode.

A frequency adjustment film 14 is arranged above the upper electrode 12. In the region outside the piezoelectric vibrating portion in which the upper electrode 12 and the lower electrode 13 overlap each other, a mass adding film 15 is arranged on the upper surface of the piezoelectric thin film 5 along the area surrounding the piezoelectric vibrating portion. In the piezoelectric resonator 4, the lower electrode 13 extends to the region in which the mass adding film 15 is disposed.

It is noted that, in the piezoelectric resonator 4, the lower electrode 13 is thicker than the upper electrode 12.

Therefore, the mass adding function on the piezoelectric thin film 5 by the lower electrode 13 is greater than that of the lower electrode 9 of the piezoelectric resonator 3. Accordingly, the piezoelectric resonators 3 and 4 having different resonant frequencies can be provided, while the same substrate 2 and the same piezoelectric thin film 5 are used. In other words, the piezoelectric resonator 4 having resonant characteristics different from those of the piezoelectric resonator 3 can be easily provided by adjusting the thickness and material of the lower electrode 13 and the thickness and the material of the frequency adjustment film 14. In this case, even when the frequency adjustment film 14 is made of the same material as the frequency adjustment film 10 and has substantially the same thickness as that of the frequency adjustment film 10, the piezoelectric resonators 3 and 4 having different resonant characteristics can be easily provided by adjusting the thickness of the lower electrode 13 to be different from the thickness of the lower electrode 9, for example.

In the present preferred embodiment, the electrode material of the upper electrode 12 and that of the lower electrode 13 are preferably substantially the same as the electrode material of the upper electrode 8 and that of the lower electrode 9 of the piezoelectric resonator 3, respectively. It is noted that, as in the experimental examples described below, the thickness of each of the metallic layers of the upper electrode 12 and the lower electrode 13 of the piezoelectric resonator 4 is preferably different from the thickness of each of the metallic layers in the piezoelectric resonator 3.

In the piezoelectric filter 1 according to the present preferred embodiment, the piezoelectric resonators 3 and 4 having different resonant characteristics are disposed on the same substrate 2, and the piezoelectric resonators 3 and 4 are electrically connected to each other at a portion that is not shown, thus defining a filter circuit. Examples of such a filter circuit are described below.

Also in the piezoelectric resonator 4, the piezoelectric vibrating portion using the piezoelectric thin film 5 is spaced apart from the substrate 2 with the cavity 7 disposed therebetween.

Such a configuration, in which the piezoelectric vibrating portion of each of the piezoelectric resonators 3 and 4 is spaced apart from the substrate 2 with the cavity 6 or 7 disposed therebetween, can be obtained using various methods.

One example is a method of providing a solvent-removable material layer, which is readily removable by solvent, to a portion in which each of the cavities 6 and 7 is to be provided on the substrate 2, then forming a laminated thin film including the upper electrodes 8 and 12, the lower electrodes 9 and 13, and the piezoelectric thin film 5, and dissolving and removing the solvent-removable material layer using a solvent that does not remove the laminated thin film portion but does remove the solvent-removable material layer. According to this method, the solvent-removable material layer is dissolved and removed using a solvent, and the cavities 6 and 7 are thereby formed. It is noted that the mass adding films 11 and 15 and the frequency adjustment films 10 and 14 may be formed before the formation of the cavities 6 and 7 or may be formed after the formation of the cavities 6 and 7.

Figure 2A:
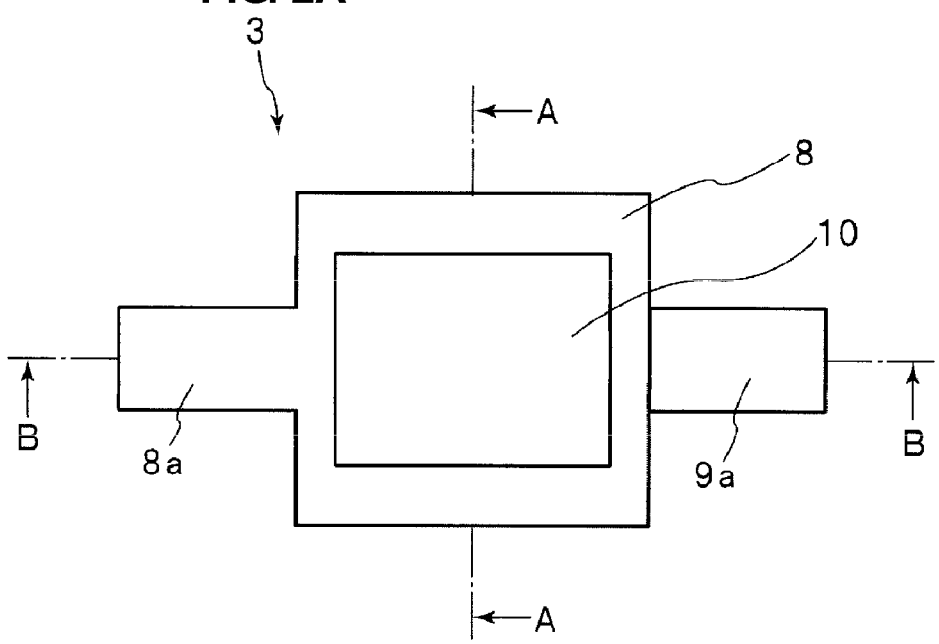
FIGS. 2A and 2B are a schematic plan view of a portion in which one piezoelectric resonator of the piezoelectric filter according to the first preferred embodiment is disposed and a schematic cross-sectional view of the piezoelectric resonator.
Figure 2B:
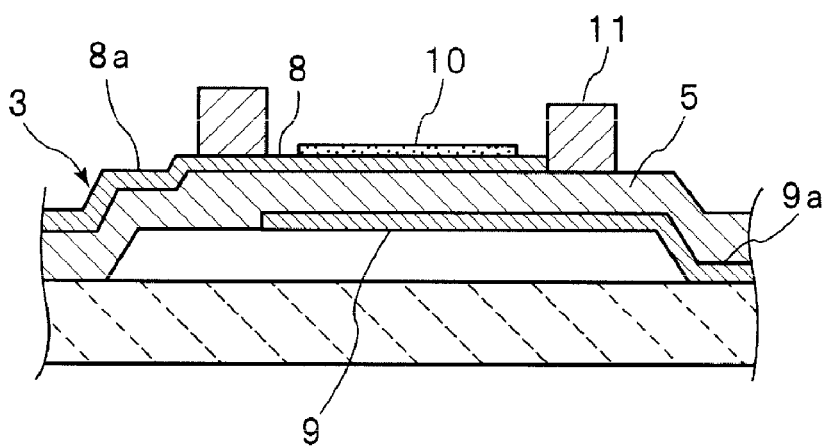

In FIG. 1, the main portion of the piezoelectric resonator 3 and the piezoelectric resonator 4 is shown in a front cross-sectional view. The upper electrodes 8 and 12 and the lower electrodes 9 and 13 extend outward from the respective piezoelectric vibrating portions at a cross-sectional portion that is different from the portion shown in FIG. 1. This is described with reference to FIGS. 2A and 2B. FIG. 2A is a schematic plan view of the portion in which the piezoelectric resonator 3 is disposed, and FIG. 2B is a cross-sectional view taken along the line B-B in FIG. 2A. In FIG. 1, a cross-sectional view of the piezoelectric resonator 3 is taken along the line A-A in FIG. 2A. As illustrated in FIGS. 2A and 2B, in the piezoelectric resonator 3, the upper electrode 8 and the lower electrode 9 are arranged so as to extend outside of the piezoelectric vibrating portion and include electrode connection portions 8a and 9a, respectively. The piezoelectric resonator 3 is preferably electrically connected to another piezoelectric resonator, an external terminal, or other electronic component element, for example, through the electrode connection portions 8a and 9a.

Although the planar shape of the piezoelectric vibrating portion illustrated in FIG. 2A is a substantially square, the planar shape of the piezoelectric portion may preferably be substantially rectangular in order to reduce the area of a device in layout of the piezoelectric resonator. For example, it is preferable that the planar shape of the electrode of the piezoelectric resonator be substantially rectangular, and particularly, a substantial rectangle having sides substantially in the golden ratio known as 1 to $(1+\sqrt{5})/2$ as the ratio of the longer side to the shorter side because the area of a filter including a plurality of piezoelectric resonators can be readily reduced by using such a substantially rectangular shape. It is noted that, in preferred embodiments of the present invention, the planar shape of the piezoelectric vibrating portion, in which the lower electrode and the upper electrode overlap each other, can be changed to various suitable shapes, in addition to a substantial square and a substantial rectangle, such as a substantial circle, a substantial oval, and a substantial regular polygon other than a square, for example.

Next, the ability to suppress vibration that appears at frequencies greater than the resonant frequency of each of the piezoelectric resonators 3 and 4 and that occurs along the direction of the plane of the piezoelectric thin film 5, for example, spurious Lamb waves, is described below with reference to specific experimental examples.

Figure 3:
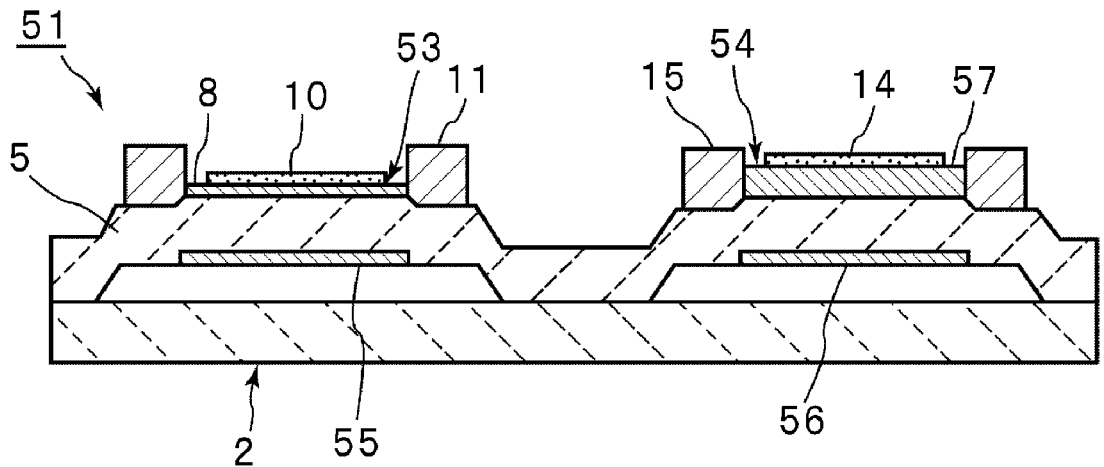
FIG. 3 is a schematic front cross-sectional view of a piezoelectric filter according to a first comparative example.

The inventors of the present invention developed a piezoelectric filter 51 of a first comparative example illustrated in FIG. 3 prior to developing the present invention, although it is not yet publicly known. The piezoelectric filter 51 includes piezoelectric resonators 53 and 54 that are provided on the same substrate 2 using the piezoelectric thin film 5, in a similar manner as the piezoelectric filter 1. The piezoelectric filter 51 differs from the piezoelectric filter 1 in that, as illustrated in FIG. 3, the sizes of lower electrodes 55 and 56 defining the second electrode are substantially the same as the sizes of the upper electrodes 8 and 12, whereas, in the piezoelectric filter 1, the lower electrodes 9 and 13 defining the second electrode extend to regions disposed under the mass adding films 11 and 15, respectively. That is, each of the lower electrodes 55 and 56 is arranged only in the piezoelectric vibrating portion, so as not to extend to a region surrounding the piezoelectric vibrating portion. In contrast to the upper electrode 12 (see FIG. 1), an upper electrode 57 of the piezoelectric resonator 54 has a significantly larger thickness in the present comparative example. The remainder of the piezoelectric filter 51 is substantially the same as the piezoelectric filter 1, and the detailed description thereof is omitted.

In the piezoelectric filter 51, the film thickness and material of each portion were set as shown in Table 1 below. In such a manner, the piezoelectric filter 51 having a ladder circuit configuration and having a designed resonant frequency of about 1883 MHz at the piezoelectric resonator 53 and a designed resonant frequency of about 1822 MHz at the piezoelectric resonator 54 was provided.

TABLE 1

| Film Thickness (nm) | Resonator 53 | Resonator 54 |
|---|---|---|
| Frequency Adjustment Film | 20 | 20 |
| Mass Adding Film | 480 | 480 |
| Upper Electrode (Al/Ti) | 100/10 | 205/10 |
| Piezoelectric Thin Film (AlN) | 2556 | 2556 |
| Lower Electrode (Pt/Ti/Al/Ti) | 10/10/100/10 | 10/10/100/10 |

Figure 4A:
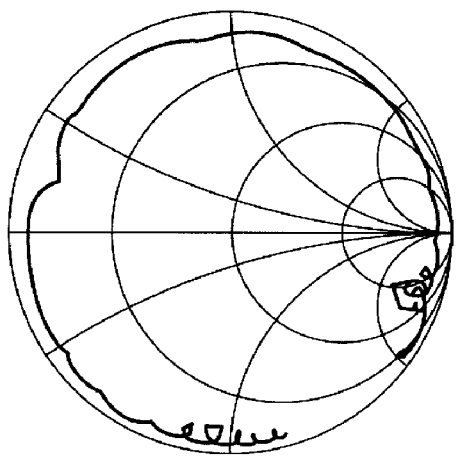
FIGS. 4A and 4B are Smith charts that illustrate resonant characteristics of one piezoelectric resonator and those of the other piezoelectric resonator of the piezoelectric filter according to the first comparative example shown in FIG. 3, respectively.
Figure 4B:
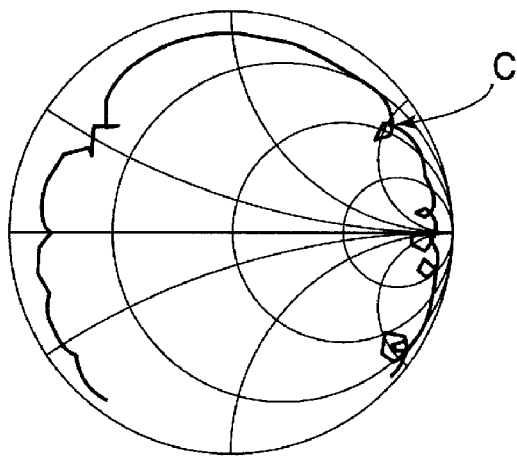

The resonant characteristics of the piezoelectric resonators 53 and 54 are shown in FIGS. 4A and 4B using impedance Smith charts. The resonant characteristics are shown using impedance Smith charts, instead of impedance-frequency characteristic charts, because the impedance Smith charts more clearly show a state in which a spurious component appears in a higher range.

FIG. 4A illustrates the resonant characteristics of the piezoelectric resonator 53, and FIG. 4B illustrates the resonant characteristics of the piezoelectric resonator 54.

As shown in FIGS. 4A and 4B, in the piezoelectric resonator 54, as indicated by the arrow C, a large spurious component occurs in frequencies above the resonant frequency. The reason for the larger spurious component occurring in the piezoelectric resonator 54, as compared to the piezoelectric resonator 53, may be that the mass adding function produced by the mass adding film 15 is insufficient. That is, it was determined that, when the piezoelectric filter 51 is designed, when the resonant characteristics of the piezoelectric resonator 53 are optimized, the mass adding function produced by the mass adding film is insufficient, and thus, a spurious component occurring in a frequency greater than the above-mentioned frequency cannot be effectively suppressed in the piezoelectric resonator 54.

Figure 5:
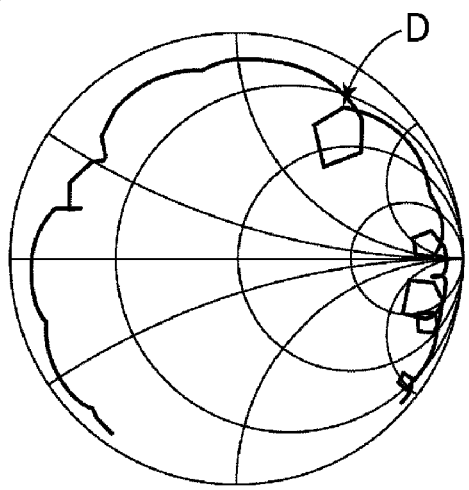
FIG. 5 is a Smith chart that illustrates resonant characteristics of one piezoelectric resonator of the piezoelectric filter according to the first comparative example when the film thickness of a mass adding film of the piezoelectric resonator is increased to about 600 nm.

In the present comparative example, the difference in mass at the surrounding area of the piezoelectric vibrating portion in the piezoelectric resonator 53 depends on the difference in thickness between the electrode layers made of Al having a density of 2.69 g/m³, i.e., a difference in thickness of 205–100=105 nm, for example. In the case of SiO₂ having a density of 2.2 g/m³, this corresponds to a SiO₂ layer having a thickness of about 128 nm. However, it has been shown that, even when the thickness of the mass adding film made of a SiO₂ film on the piezoelectric resonator 54 is changed from about 480 nm to about 600 nm, a spurious component D appearing in frequencies higher than the resonant frequency cannot be suppressed, as shown in FIG. 5.

The reason for this may be that, because an increase in the proportion of SiO₂ to the principle material of the vibrating portion, i.e., the piezoelectric thin film made of AlN, produces a difference in Poisson's ratio between the vibrated piezoelectric thin film portion and the mass adding film, Lamb waves do not propagate outside the vibrating portion.

Figure 6:
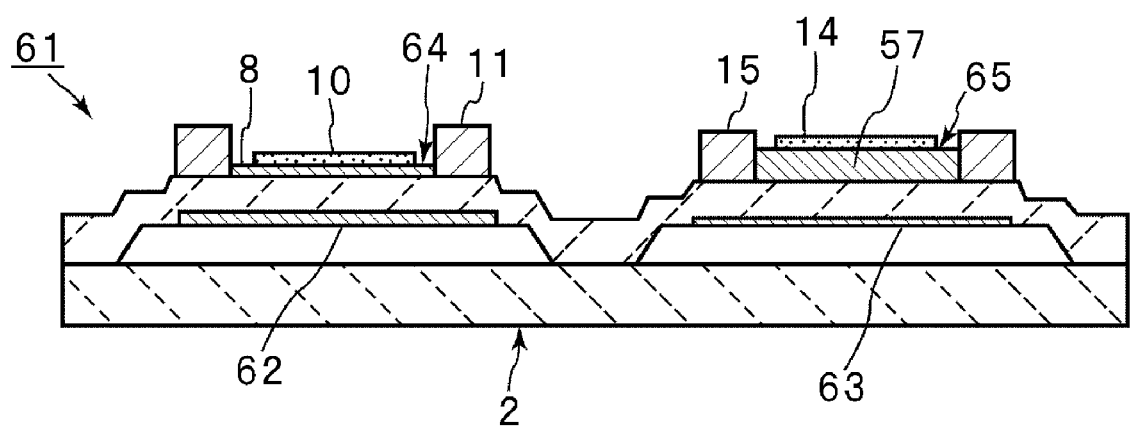
FIG. 6 is a schematic front cross-sectional view of a piezoelectric filter according to a second comparative example.

As described above, because a spurious component occurring in frequencies higher than the resonant frequency cannot be suppressed in the first comparative example illustrated in FIG. 3, the inventors of the present invention studied a piezoelectric filter 61 according to a second comparative example illustrated in FIG. 6.

The piezoelectric filter 61 illustrated in FIG. 6 differs from the piezoelectric filter 51 illustrated in FIG. 3 in that lower electrodes 62 and 63 defining the second electrode in piezoelectric resonators 64 and 65, respectively, extend outside of the respective piezoelectric vibrating portions. Other than the lower electrodes 64 and 65, the piezoelectric filter 61 is substantially the same as the piezoelectric filter 51.

TABLE 2

| Film Thickness (nm) | Resonator 64 | Resonator 65 |
| --- | --- | --- |
| Frequency Adjustment Film | 20 | 20 |
| Mass Adding Film | 320 | 320 |
| Upper Electrode (Al/Ti) | 100/10 | 205/10 |
| Piezoelectric Thin Film (AlN) | 2556 | 2556 |
| Lower Electrode (Pt/Ti/Al/Ti) | 10/10/100/10 | 10/10/100/10 |

Figure 7A:
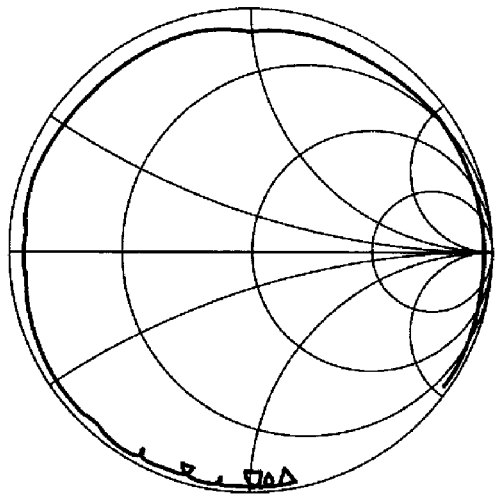
FIGS. 7A and 7B are impedance Smith charts that illustrate resonant characteristics of one piezoelectric resonator and those of the other piezoelectric resonator of the piezoelectric filter according to the second comparative example, respectively.

The piezoelectric filter 61 was configured such that the film thickness and material of each portion were set as shown in Table 2 and the other elements were substantially the same as in the piezoelectric filter 51 of the first comparative example. The resonant characteristics of the piezoelectric resonators 64 and 65 of the piezoelectric filter 61 are shown in FIGS. 7A and 7B, respectively.

Figure 7B:
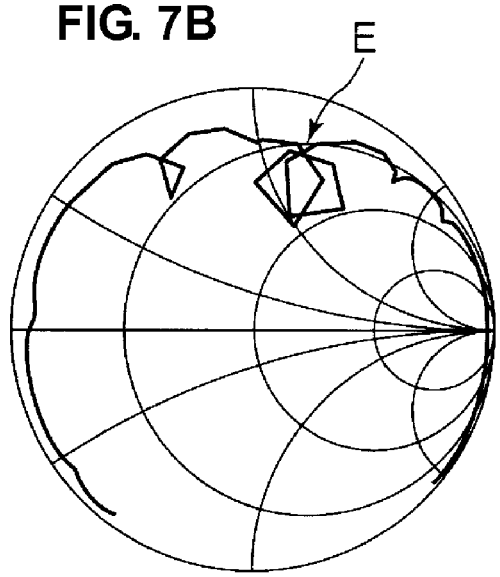

As shown in FIG. 7B, in the piezoelectric resonator 65, as indicated by the arrow E, a spurious component occurs in frequencies greater than the resonant frequency and the spurious component is not suppressed.

The reason that the resonant characteristics of the piezoelectric resonator 65 in the piezoelectric resonant filter device 61 are not sufficient is that mass adding is not provided in the piezoelectric resonator 65. Therefore, as in the piezoelectric filter 51, the resonant characteristics of the piezoelectric resonator 65 occurring when the thickness of the mass adding film 15 made of SiO₂ is increased from about 320 μm to about 440 nm are shown in FIG. 8.

Figure 8:
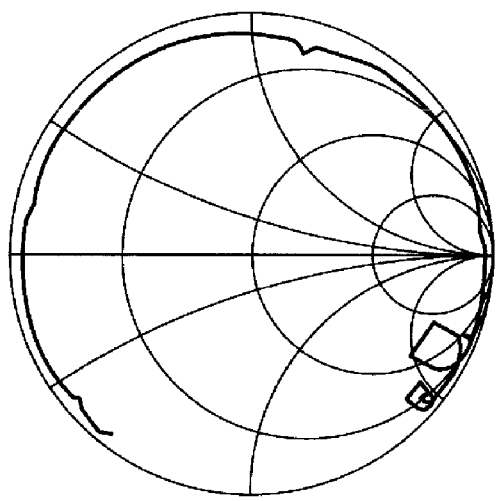
FIG. 8 is an impedance Smith chart that illustrates resonant characteristics of one piezoelectric resonator of the piezoelectric filter according to the second comparative example when the thickness of a mass adding film of the piezoelectric resonator is increased.

As shown in FIG. 8, it was determined that the increase in the thickness of the mass adding film to about 400 nm improves the mass adding function, such that the spurious component occurring in frequencies greater than the resonant frequency is suppressed.

However, in such a configuration, different mass adding films must be prepared for the piezoelectric resonators 64 and 65. As a result, the manufacturing process is complicated, and the manufacturing cost is increased.

In contrast, the piezoelectric filter 1 according to the present preferred embodiment can use the same material and the same film thickness in the mass adding films 11 and 15 used in the piezoelectric resonators 3 and 4, respectively. This does not increase the number of steps. In addition, a spurious component occurring in frequencies greater than the resonant frequency can be effectively suppressed in the piezoelectric resonator 4. This is described with reference to FIGS. 9A and 9B.

The piezoelectric filter 1 was made such that the material and the thickness of each thin film portion of the piezoelectric filter 1 were set as shown in Table 3 below.

TABLE 3

| Film Thickness (nm) | Resonator 3 | Resonator 4 |
| --- | --- | --- |
| Frequency Adjustment Film | 20 | 20 |
| Mass Adding Film | 320 | 320 |
| Upper Electrode (Al/Ti) | 100/10 | 100/10 |
| Piezoelectric Thin Film (AlN) | 2556 | 2556 |
| Lower Electrode (Pt/Ti/Al/Ti) | 10/10/100/10 | 10/10/205/10 |

Figure 9A:
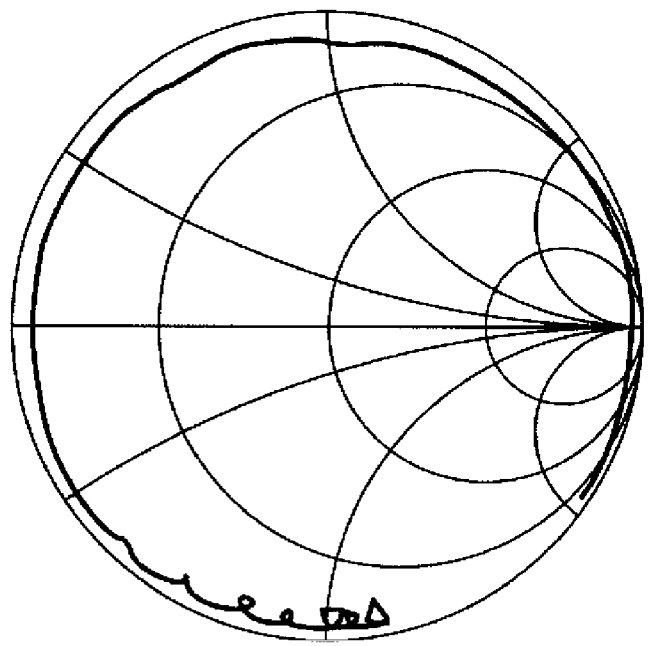
FIGS. 9A and 9B are impedance Smith charts that illustrate resonant characteristics of one piezoelectric resonator and those of the other piezoelectric resonator of the piezoelectric filter according to the first preferred embodiment of the present invention, respectively.
Figure 9B:
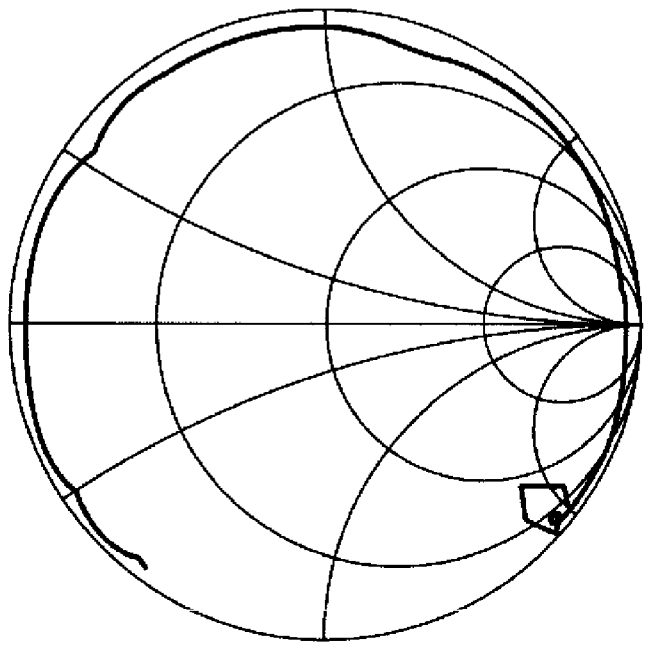
Figure 10A:
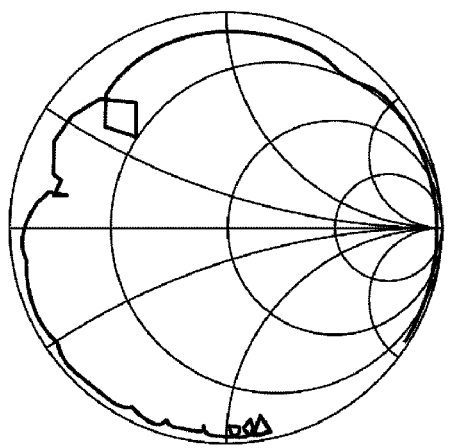
FIGS. 10A to 10C are impedance Smith charts that illustrate resonant characteristics of one piezoelectric resonator of the piezoelectric filter according to the first preferred embodiment when the film thickness of a mass adding film of the piezoelectric resonator is changed to about 240 nm, about 260 nm, and about 320 nm, respectively.
Figure 10B:
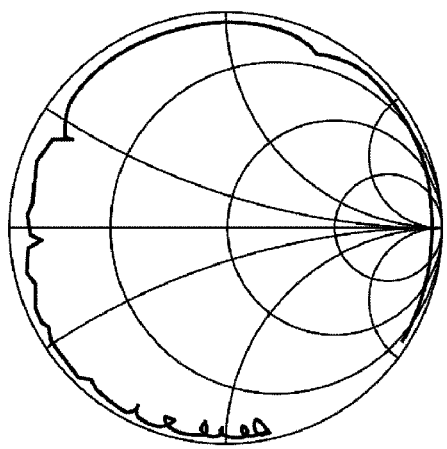
Figure 10C:
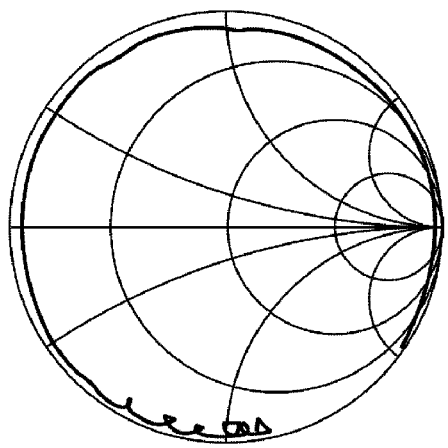
Figure 11A:
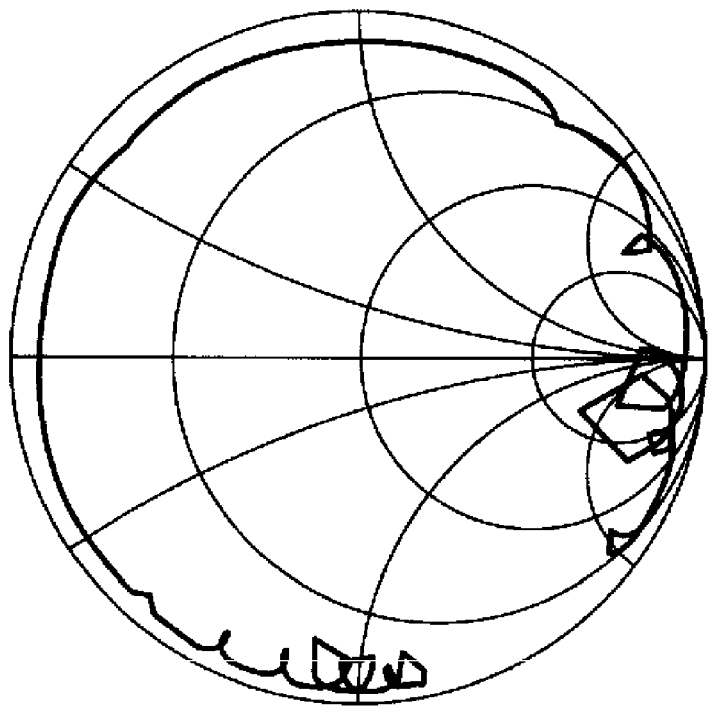
FIGS. 11A and 11B are impedance Smith charts that illustrate resonant characteristics of one piezoelectric resonator of the piezoelectric filter according to the first preferred embodiment when the film thickness of the mass adding film of the piezoelectric resonator is changed to about 420 nm and about 440 nm, respectively.
Figure 11B:
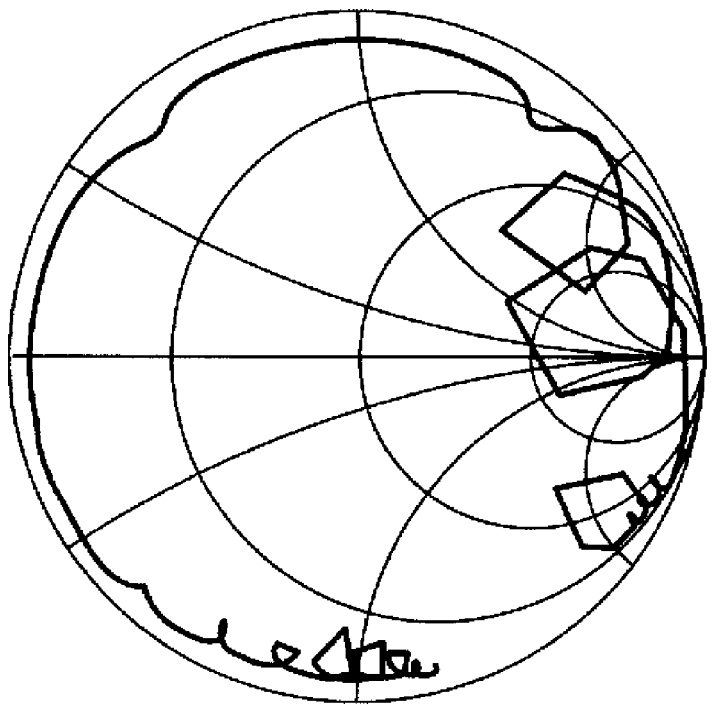

The resonant characteristics of the piezoelectric resonators 3 and 4 are illustrated in FIGS. 9A and 9B using impedance Smith charts.

As shown in FIG. 9A, it was determined that, in the piezoelectric resonator 3 and in the piezoelectric resonator 4, a spurious component is suppressed in frequencies greater than their respective resonant frequencies. The reason for this is described below. In the piezoelectric filter 1, the piezoelectric resonator 3 is optimized, and a spurious component in the piezoelectric resonator 3 is suppressed. In this case, although a spurious component would be likely to occur in the piezoelectric resonator 4, in the present preferred embodiment, because the lower electrode 13 defining the second electrode extends to a location that overlaps the mass adding film 15 and the film thickness of the lower electrode 13 is greater than that of the upper electrode 12, a sufficient mass adding function is obtained from the portion adjacent to the outer area of the lower electrode 13. Consequently, a spurious component occurring in frequencies greater than the resonant frequency can be effectively suppressed.

In the above-described preferred embodiment, each of the mass adding films 11 and 15 made of SiO₂ has a thickness of about 320 μm. A spurious component occurring in the resonant characteristics can be suppressed by changing the thickness of the mass adding film.

FIGS. 10A to 10C and FIGS. 11A and 11B are Smith charts that show changes in the resonant characteristics of the piezoelectric resonator 3 in the first preferred embodiment when the thickness of the mass adding film 11 is changed to about 240 nm, about 260 nm, about 320 nm, about 420 nm, and about 440 nm.

As shown in FIGS. 10A to 11B, it was determined that the degree of suppression of a spurious component occurring in the resonant characteristics is changed by changing the thickness of the mass adding film 11. In particular, it was determined that, when the mass adding film 11 has a thickness of about 260 to about 420 nm, a spurious component can be effectively suppressed. The reason for this may be that these cases enable Lamb waves, which cause a spurious component, to escape to the outside of the vibrating portion without confining them in the vibrating portion.

Figure 13:
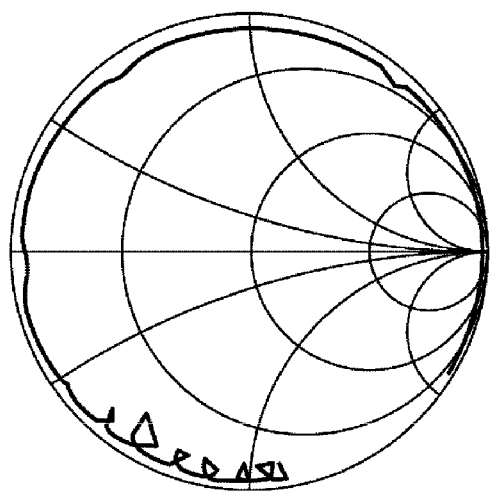
FIG. 13 is an impedance Smith chart that illustrates resonant characteristics of one piezoelectric resonator of a piezoelectric filter according to a modified example in which an electrode material is a material primarily made of platinum (Pt).

In the above-described preferred embodiment, as shown in Table 3, a laminated metallic film including an Al layer having a film thickness of about 100 nm and a Ti layer having a thickness of about 10 nm was used as the upper electrode. A laminated structure in which Pt/Ti/Al/Ti layers have film thicknesses of about 10 nm/about 10 nm/about 100 nm/about 10 nm was used as the lower electrode 9. In contrast, the inventors of the present invention found that, when the film thickness and material of the AlN film of the piezoelectric thin film and those of the other thin films were set as shown in Table 4 below, more preferable resonant characteristics having no spurious component between the resonant frequency and the anti-resonant frequency were obtained, as illustrated in the Smith chart in FIG. 13.

TABLE 4

| Film Thickness (nm) | Resonator |
| --- | --- |
| Frequency Adjustment Film SiO$_2$ | 20 |
| Mass Adding Film AlN | 690 |
| Upper Electrode (Al/Ti/Pt/Ti) | 100/10/80/10 |
| Piezoelectric Thin Film (AlN) | 1690 |
| Lower Electrode (Pt/Ti/Al/Ti) | 80/10/100/10 |

Figure 12:
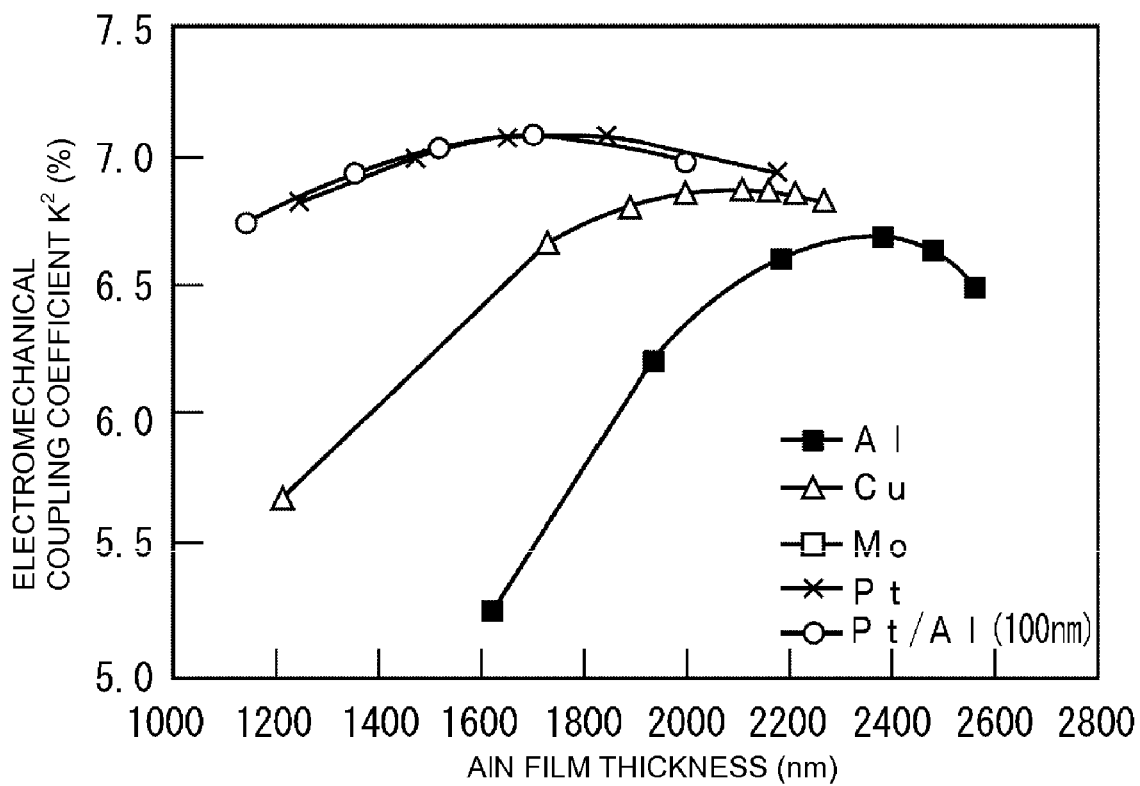
FIG. 12 illustrates a relationship between the thickness of a piezoelectric thin film made of aluminum nitride (AlN) and the electromechanical coupling coefficient $k_r^2 = \pi^2/4 \times fs(fp-fs)/fp \times 100(\%)$, where fs is the resonant frequency and fp is the anti-resonant frequency, when various metallic electrodes are provided.

As illustrated in FIG. 12, when a piezoelectric film made of AlN is used and the electrode material is Al, copper (Cu), molybdenum (Mo), Pt, or a Pt—Al alloy, for example, the electromechanical coupling coefficient $K^2$ changes depending on the film thickness of the AlN film. To obtain a large fractional bandwidth, as shown in FIG. 12, an electrode material preferably having a relatively high density, such as Pt, should be used. When an electrode material having a relatively high density is used, the thickness of the piezoelectric thin film can be reduced, such the area of the electrode required to obtain the necessary impedance can be reduced. As a result, miniaturization of the piezoelectric resonator and the piezoelectric filter can be achieved.

When the electrode is made of a metal having a relatively high density, in order to obtain a resonator having high Q and a suppressed spurious component, it is necessary to increase the mass added to the area surrounding the piezoelectric vibrating portion.

In contrast, in the above-described preferred embodiment, mass is added to the area surrounding the piezoelectric vibrating portions using the mass adding films 11 and 15. Additionally, the lower electrodes 9 and 13 extend outside of the respective piezoelectric vibrating portions, such that a portion of the lower electrodes 9 and 13 also adds mass. Therefore, an increase in bandwidth and miniaturization of an element can be achieved by using an electrode material having a high density, such as Pt, as the primary material of the laminated metallic film.

Accordingly, in preferred embodiments of the present invention, preferably, the upper electrode and the lower electrode, which define the first and second electrodes, respectively, are made of an electrode material that includes Pt, which has a relatively high density, as the main electrode layer. In the above-described preferred embodiment, the mass adding film is preferably made of SiO$_2$. However, the mass adding film can also be made of various suitable dielectric materials or of an insulating material, such as AlN or ZnO, for example.

In addition to SiO$_2$, another suitable dielectric material or insulating material that enables the resonant frequency to be finely adjusted by adding mass can be used in the frequency adjustment film, for example.

In the first preferred embodiment, the piezoelectric filter 1 including the plurality of piezoelectric resonators 3 and 4 is described. As in the piezoelectric resonator 4, the second electrode 13 may have a greater mass adding effect configuring the lower electrode 13 defining the second electrode so as to extend outside the piezoelectric vibrating portion and to have a thickness greater than that of the first electrode 12. Therefore, such a piezoelectric resonator is also a preferred embodiment of the present invention.

Next, one example method of making a piezoelectric resonator according to a modification example of the above embodiment will be described.

In the above-described preferred embodiment, as previously described, the piezoelectric resonators 3 and 4 in the piezoelectric filter 1 were arranged such that they are spaced apart from the substrate 2 with the cavities 6 and 7 disposed therebetween, respectively. One example of a method of making such a piezoelectric resonator using a solvent-removable material has been previously described. A more specific method is described below with reference to FIGS. 14A to 17B.

Figure 14A:
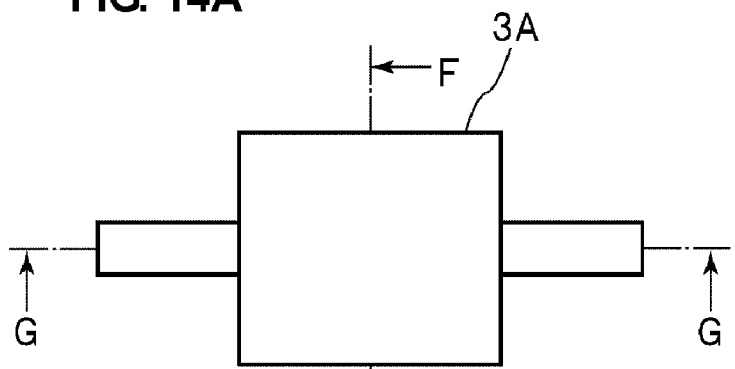
FIG. 14A to 14C are illustrations to show a method of making a piezoelectric filter according to a modified example of a preferred embodiment of the present invention and are a schematic plan view that illustrates a main portion of one piezoelectric resonator of an obtained piezoelectric filter, a cross-sectional view taken along the line F-F in FIG. 14A, and a cross-sectional view taken along the line G-G therein, respectively.
Figure 14B:
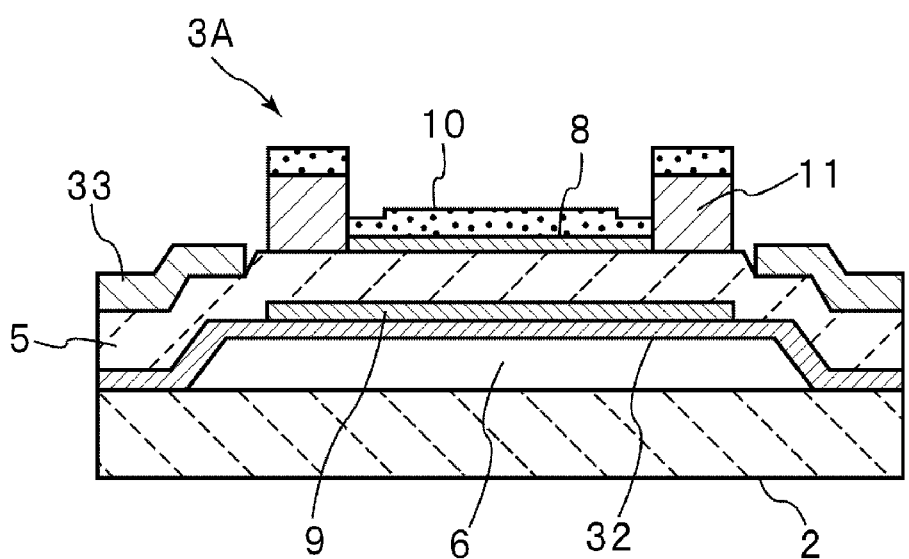
Figure 14C:
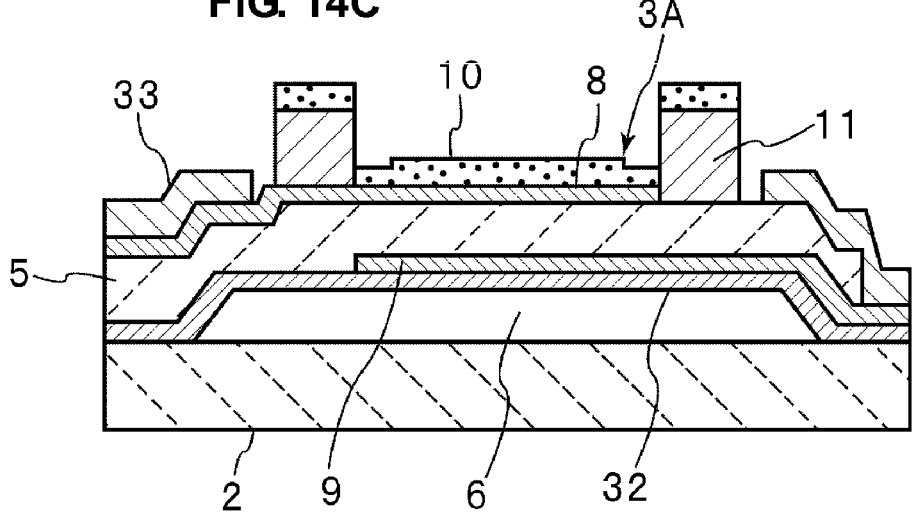

In the present modified example, the main portion of a piezoelectric resonator 3A is illustrated in FIG. 14A. FIGS. 14B and 14C are cross-sectional views taken along the line F-F and line G-G in FIG. 14A, respectively. In the piezoelectric resonator 3A according to the present modified example, the piezoelectric resonator portion including a laminated thin film is spaced apart from the substrate 2 with the cavity 6 disposed therebetween, as in the case of the piezoelectric resonator 3 according to the first preferred embodiment. A method of making the piezoelectric resonator 3A is described below with reference to FIGS. 15A to 17B.

Figure 15A:
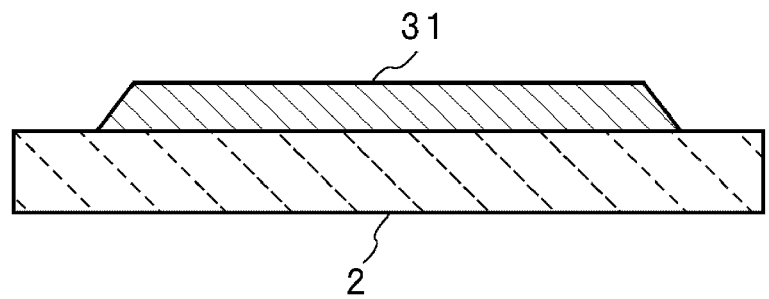
FIGS. 15A to 15D are schematic front cross-sectional views showing steps of making the piezoelectric filter according to the modified example illustrated in FIGS. 14A to 14C.

First, as illustrated in FIG. 15A, a zinc oxide (ZnO) sacrificial layer 31 as a material for forming a cavity is formed on the substrate 2. The ZnO sacrificial layer 31 can be formed by any suitable method, for example, by wet etching. In the present modified example, the ZnO sacrificial layer 31 was formed by wet etching so as to have a thickness of about 100 nm.

Figure 15B:
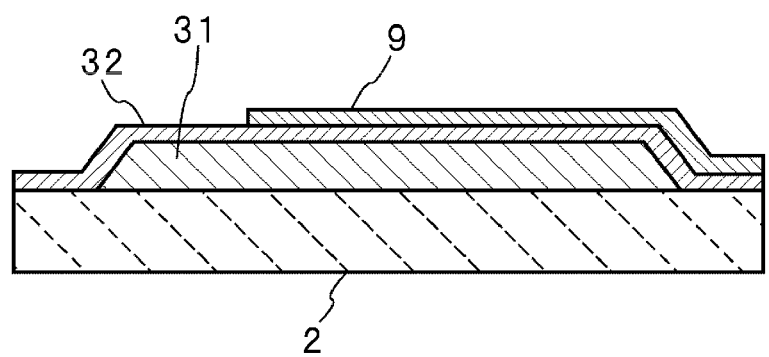

As illustrated in FIG. 15B, a protective layer 32 as the primer layer was formed so as to cover the ZnO sacrificial layer 31. The protective layer 32 was formed by a thin-film forming method in which a SiO$_2$ film having a thickness of about 100 nm was formed.

After that, a laminated metallic film of Ti, Pt, Au, Pt, and Ti layers having thicknesses of about 10 nm, about 30 nm, about 60 nm, about 10 nm, and about 10 nm was formed on the protective layer 32. After that, the laminated metallic film was patterned by photolithography, for example, thus forming the lower electrode 9.

Figure 15C:
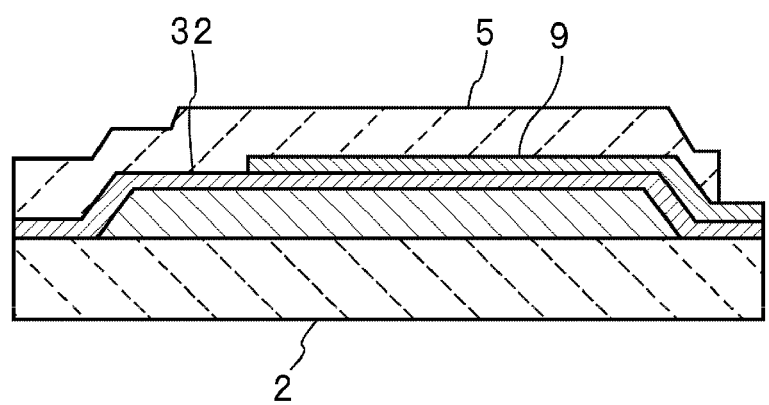

Then, the piezoelectric thin film made of AlN was formed by sputtering so as to have a thickness of about 1584 nm. As illustrated in FIG. 15C, the piezoelectric thin film was subjected to patterning, and a portion of the lower electrode 9 was exposed. In this manner, the piezoelectric thin film 5 was formed.

Figure 15D:
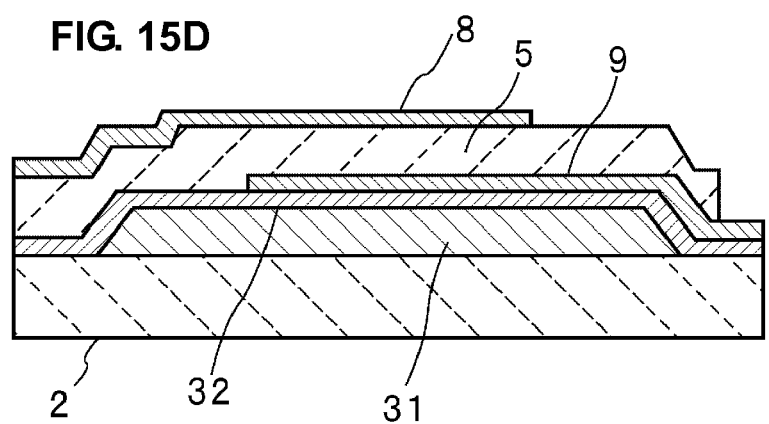

After that, as illustrated in FIG. 15D, the upper electrode 8 was formed on the piezoelectric thin film 5. The upper electrode 8 was formed by laminating metallic layers of Ti, Pt, Au, Pt, and Ti layers having thicknesses of about 10 nm, about 10 nm, about 60 nm, about 30 nm, and about 10 nm, respectively, by sputtering and then subjecting the laminated structure to patterning by the lift-off technique.

Figure 16A:
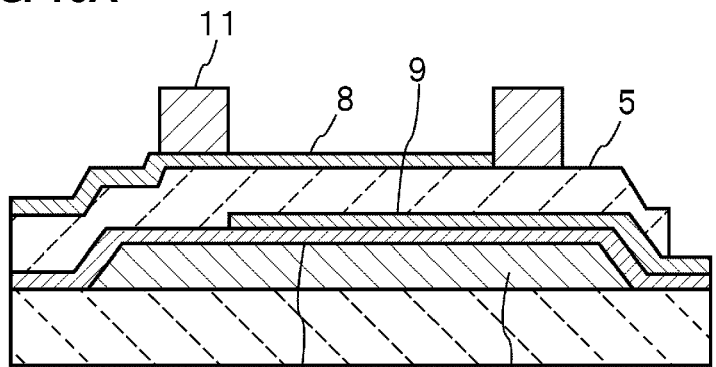
FIGS. 16A to 16D are schematic front cross-sectional view showing steps of making the piezoelectric filter according to the modified example illustrated in FIGS. 14A to 14C.

As illustrated in FIG. 16A, the mass adding film 11 made of AlN was formed on the area surrounding the piezoelectric vibrating portion on the piezoelectric thin film 5 so as to have a thickness of about 680 nm and subjected to patterning, so the mass adding film 11 was formed.

Figure 16B:
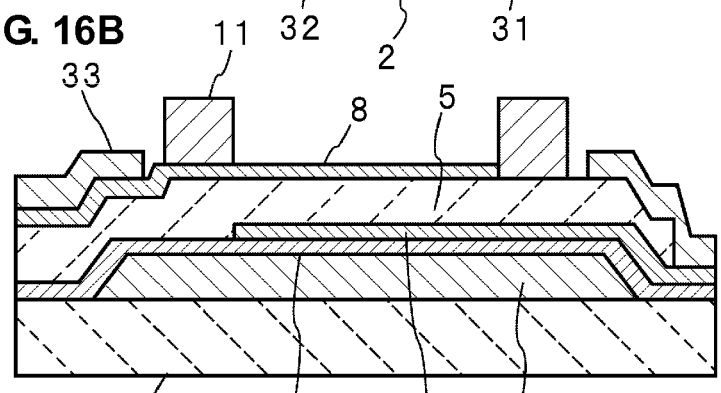

Then, as illustrated in FIG. 16B, a thick-film electrode 33 was formed by depositing Cu so as to be electrically connected to the upper electrode 8. The thickness of the thick-film electrode 33 was about 500 nm.

Figure 16C:
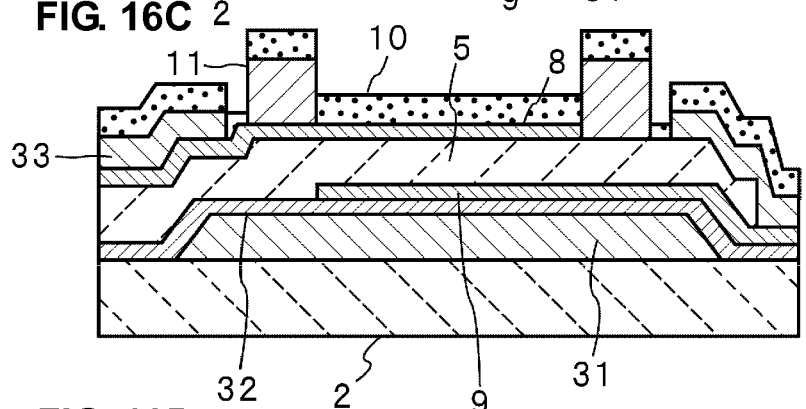

Then, as illustrated in FIG. 16C, the frequency adjustment film 10 made of $SiO_2$ was formed on the entire upper surface so as to have a thickness of about 100 nm.

Figure 16D:
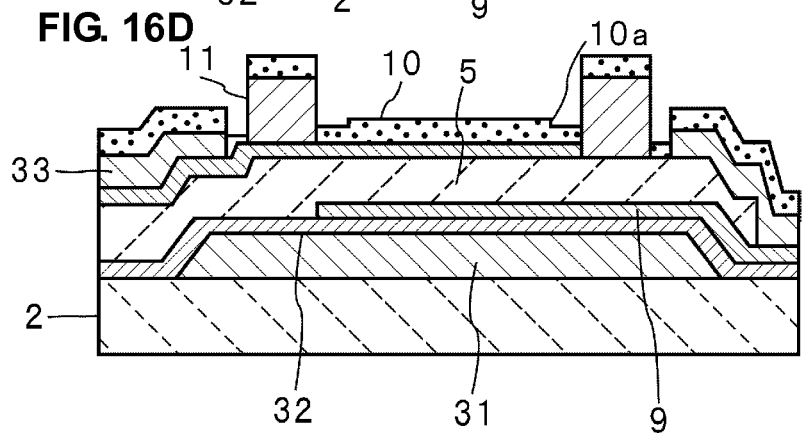

Then, as illustrated in FIG. 16D, the upper surface of the frequency adjustment film 10 was subjected to dry etching to form a step 10a. That is, the outer-edge portion of the frequency adjustment film 10 was polished by dry etching so as to reduce its thickness by about 20 nm.

Figure 17A:
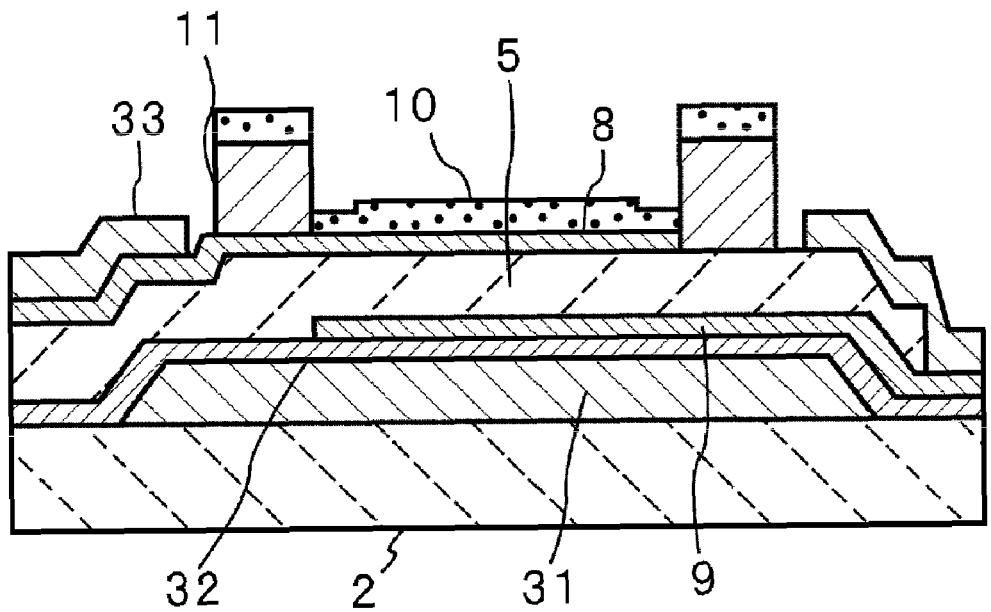
FIGS. 17A and 17B are schematic front cross-sectional view showing steps of making the piezoelectric filter according to the modified example illustrated in FIGS. 14A to 14C.
Figure 17B:
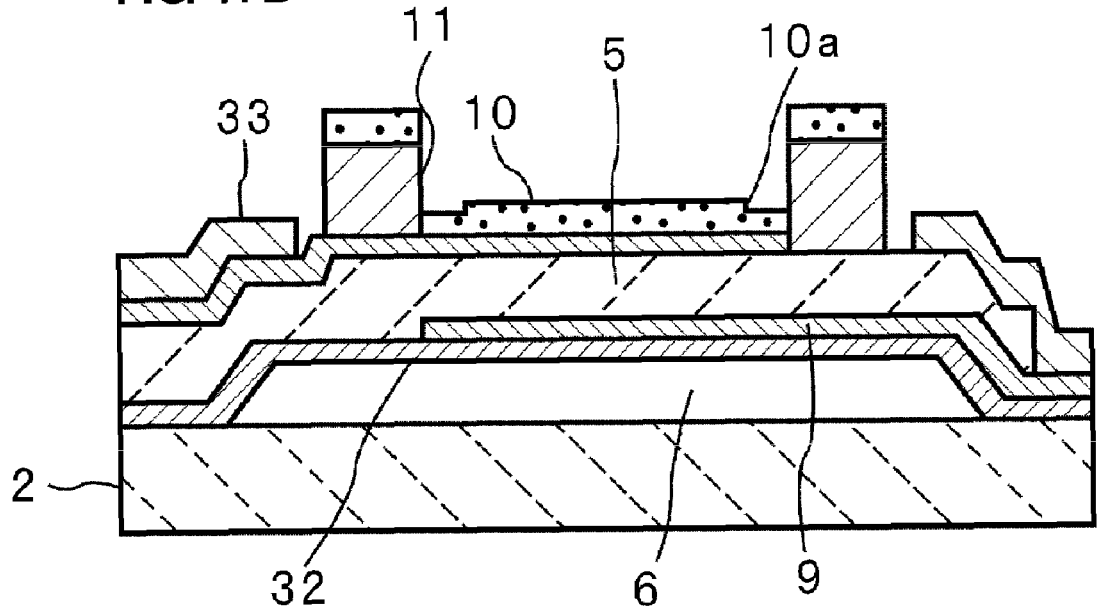

As illustrated in FIG. 17A, an electrode pad 33 was formed, and thereafter, the $SiO_2$ film was removed by dry etching at the area surrounding mass adding film 11. As illustrated in FIG. 17B, the ZnO sacrificial layer 31 was removed by wet etching, thus forming the cavity 6.

In this manner, the piezoelectric resonator 3A illustrated in FIGS. 14A to 14C was manufactured.

Piezoelectric resonators according to other modified examples of the above-described preferred embodiment are shown in FIGS. 25 to 36.

In FIGS. 25 to 36, the same reference numerals used in FIGS. 14A to 14C are used in FIGS. 25 to 36 to denote the same elements, and a detailed description thereof is omitted.

Figure 25:
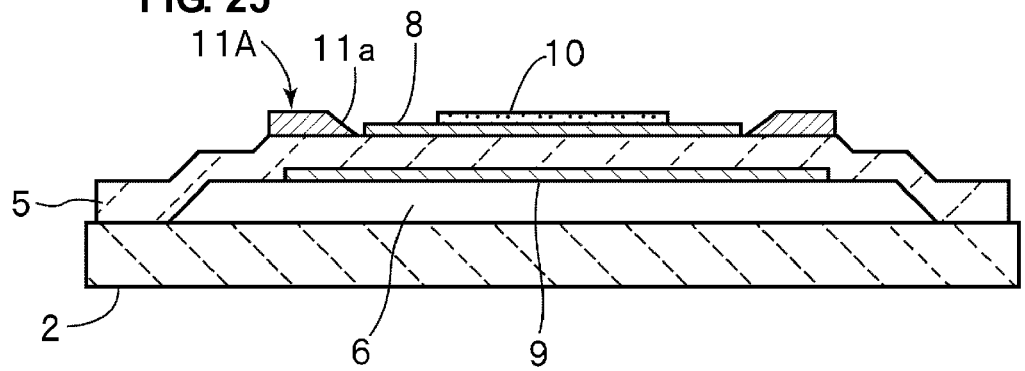
FIG. 25 is a schematic front cross-sectional view of a piezoelectric resonator according to a modified example of a preferred embodiment of the present invention.

For the piezoelectric resonator illustrated in FIG. 25, a mass adding film 11A includes an inclined portion 11a. The inclined portion 11a in the mass adding film 11A is inclined toward the portion at which the upper electrode 8 and the lower electrode 9 face each other such that the thickness of the mass adding film 11A is reduced.

Figure 26:
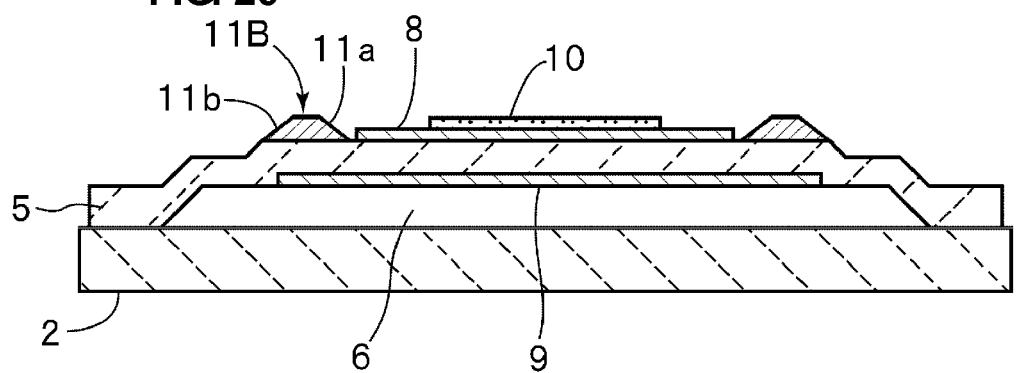
FIG. 26 is a schematic front cross-sectional view of a piezoelectric resonator according to another modified example of a preferred embodiment of the present invention.

For the piezoelectric resonator illustrated in FIG. 26, a mass adding film 11B further includes an inclined portion 11b, in addition to the inclined portion 11a. The inclined portion 11b gradually becomes thinner toward the edge opposite to the piezoelectric vibrating portion.

The inclined portion 11a shown in FIG. 25 and the inclined portions 11a and 11b shown in FIG. 26 gradually change the mass adding effect in the inclined portion(s) with a distance from the piezoelectric vibrating portion. With the inclined portions 11a and 11b, even if misregistration occurs in the photolithographic process or etching process during the formation of the mass adding film 11A or 11B, changes in the characteristics are reduced. This improves the yields of products.

Figure 27:
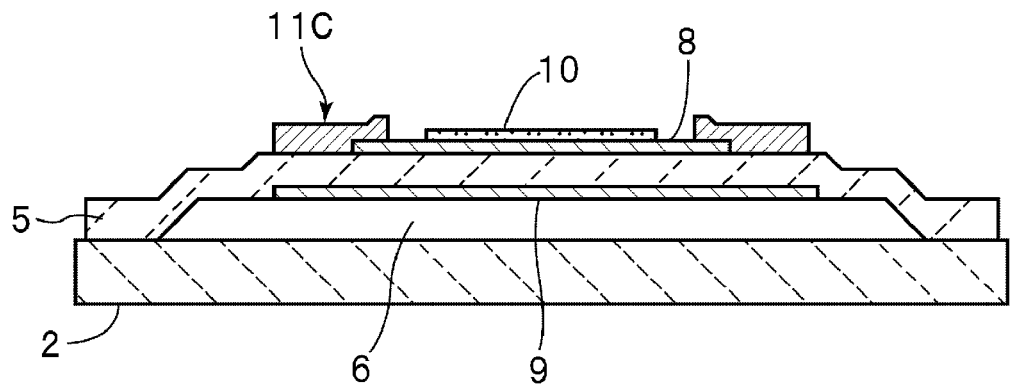
FIG. 27 is a schematic front cross-sectional view of a piezoelectric resonator according to another modified example of a preferred embodiment of the present invention.

In a modified example illustrated in FIG. 27, a portion of a mass adding film 11C may extend to the piezoelectric vibrating portion at which the upper electrode 8 and the lower electrode 9 face each other. Here, a portion of the mass adding film 11C extends to a portion of the upper surface of the upper electrode 8, which typically has a reduced size. When the mass adding film 11C is formed so as to extend to the piezoelectric vibrating portion, as described above, unnecessary vibration to be suppressed by the mass adding film 11C is likely to propagate to the mass adding film 11C. Even if misregistration occurs in the location of the mass adding film 11C in the photolithographic process or etching process used to form the mass adding film 11C, changes in the characteristics are not likely to be produced.

When a piezoelectric resonator in the 2 GHz range is designed, the width of a portion at which the mass adding film 11C overlaps the piezoelectric vibrating portion may preferably be approximately 5 μm or less, for example. The width of this overlapping portion is inversely proportional to a designed frequency for the thickness longitudinal vibration to be divided to the piezoelectric resonator. On the other hand, when the mass adding film is spaced away from the piezoelectric vibrating portion, the distance between the mass adding film and the piezoelectric vibrating portion may preferably be approximately 1 μm or less, for example. This distance is also inversely proportional to a designed frequency for the thickness longitudinal vibration.

Figure 28:
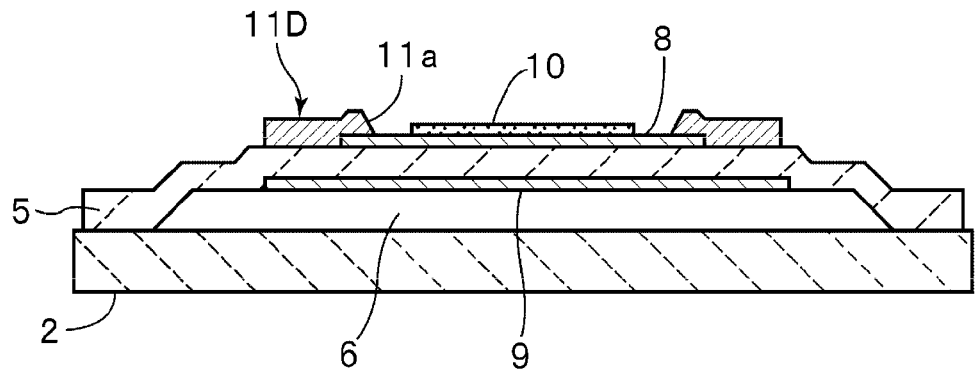
FIG. 28 is a schematic front cross-sectional view of a piezoelectric resonator according to another modified example of a preferred embodiment of the present invention.

As in a modified example illustrated in FIG. 28, a mass adding film 11D that extends to the piezoelectric vibrating portion may further include the inclined portion 11a.

Figure 29:
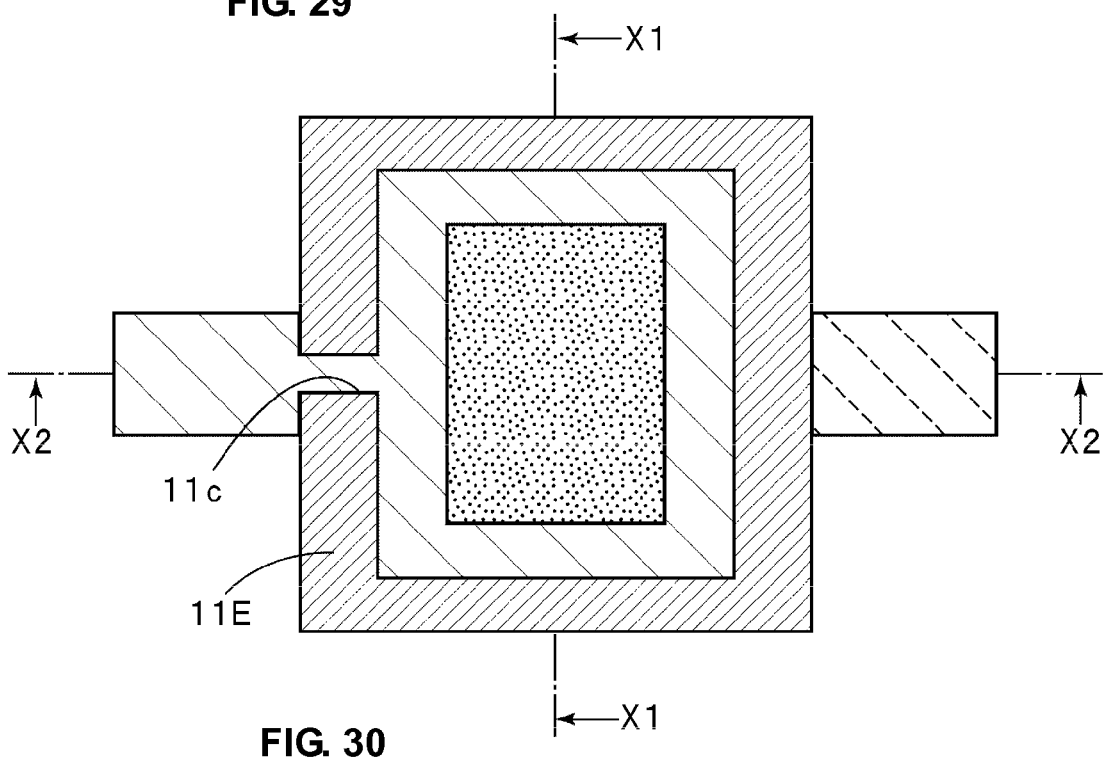
FIG. 29 is a schematic plan view of a piezoelectric resonator according to another modified example of a preferred embodiment of the present invention.
Figure 30:
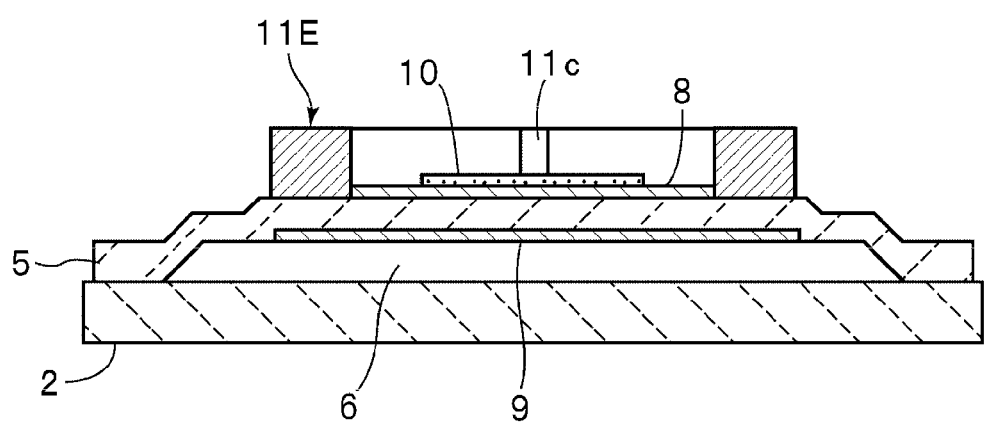
FIG. 30 is a cross-sectional view taken along the line X1-X1 in FIG. 29.
Figure 31:
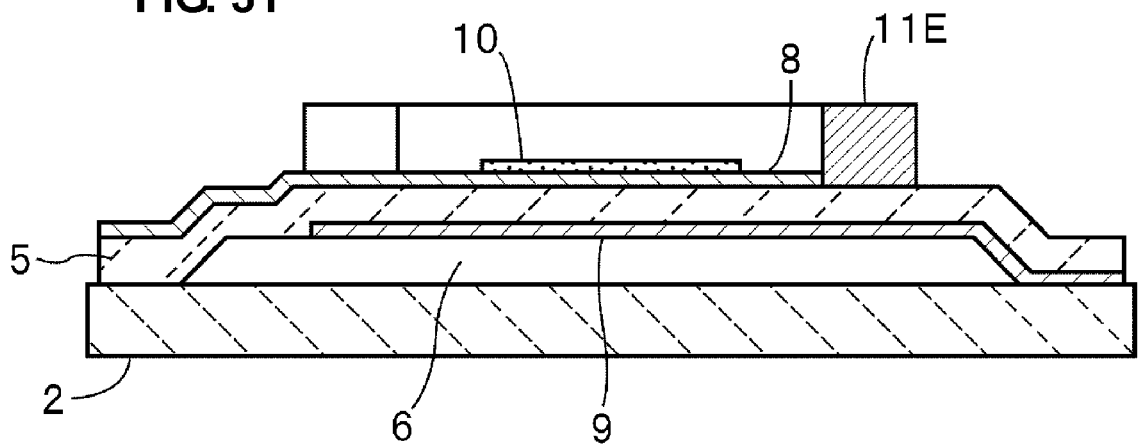
FIG. 31 is a cross-sectional view taken along the line X2-X2 in FIG. 29.

FIG. 29 is a plan view showing a piezoelectric resonator according to yet another modified example of the above-described preferred embodiment. FIG. 30 is a cross-sectional view taken along the line X1-X1 in FIG. 29. FIG. 31 is a cross-sectional view taken along the line X2-X2 in FIG. 29.

For the piezoelectric resonator according to the present modified example, a mass adding film 11E surrounding the piezoelectric vibrating portion and having a substantially rectangular-frame shape may include a cut 11c. In this case, when the lift-off technique is used to form the mass adding film 11E, a solution to dissolve the photoresist can easily enter the inside of the region in which the mass adding film 11E is formed, such that lift-off can be more easily performed. Accordingly, the manufacturing process can be simplified.

Figure 32:
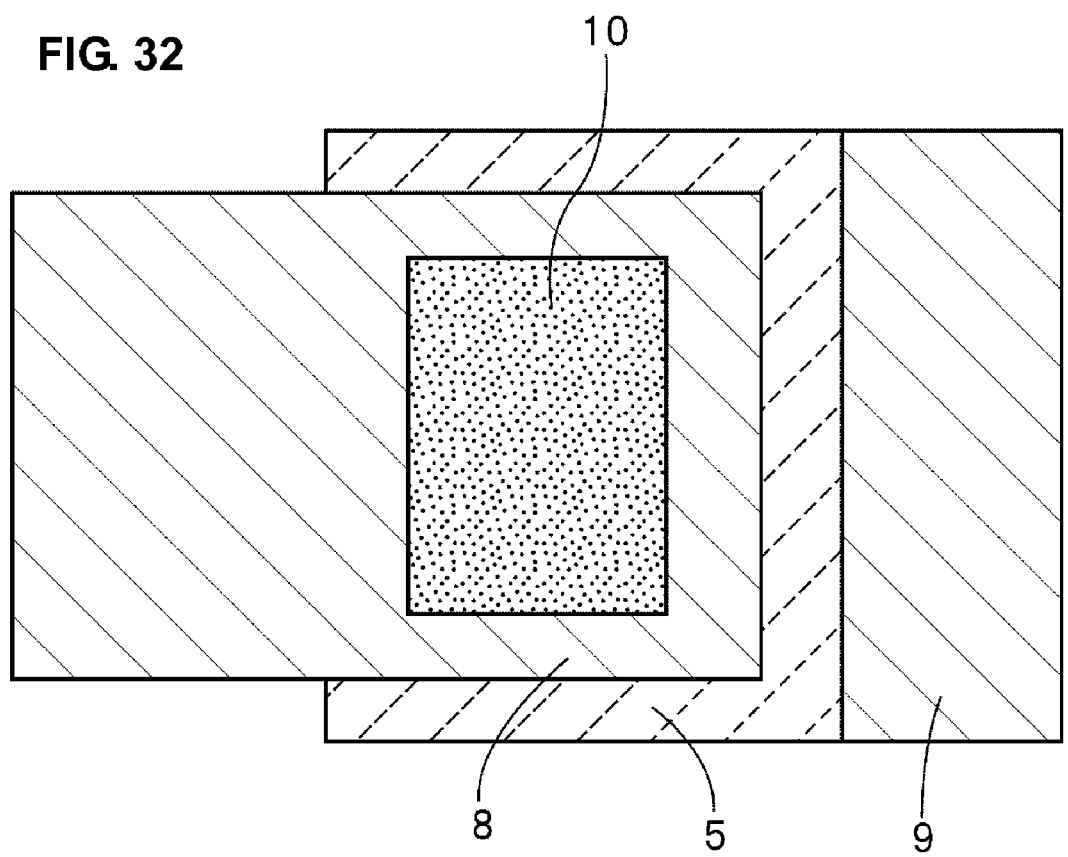
FIG. 32 is a schematic plan view of a piezoelectric resonator according to still another modified example of a preferred embodiment of the present invention.

For the piezoelectric resonator illustrated in FIG. 14 or FIG. 29, although the upper electrode 8 and the lower electrode 9 overlap each other in the piezoelectric vibrating portion, the dimension in the width direction of a portion of the upper electrode 8 or the lower electrode 9 extending outward from the piezoelectric vibrating portion is less than the width of the upper electrode 8 or the lower electrode 9 in the piezoelectric vibrating portion. However, as illustrated in FIG. 32, the upper electrode 8 and the lower electrode 9 overlapping each other in the piezoelectric vibrating portion may extend outward from the piezoelectric vibrating portion to the outside without changing the widths thereof. In this case, the wiring width can be increased such that the wiring resistance can be reduced. FIG. 32 is a schematic plan view of the piezoelectric resonator according to such a modified example.

Figure 33:
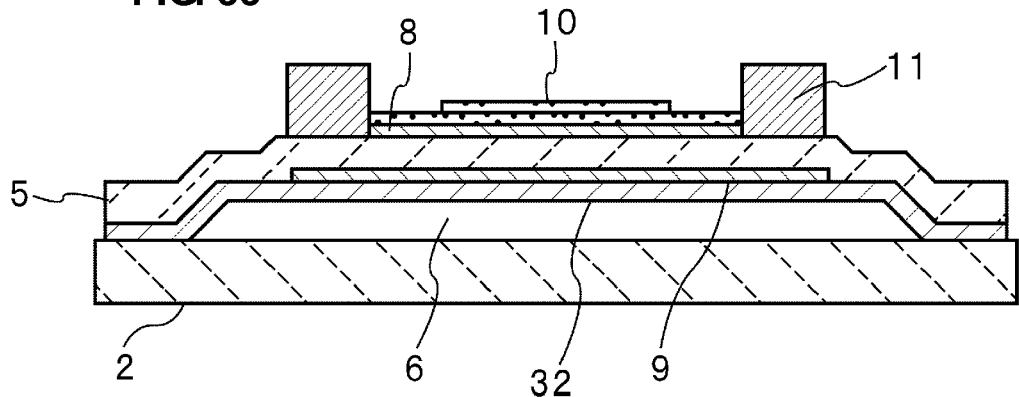
FIG. 33 is a schematic front cross-sectional view of a piezoelectric resonator according to another modified example of a preferred embodiment of the present invention.
Figure 34:
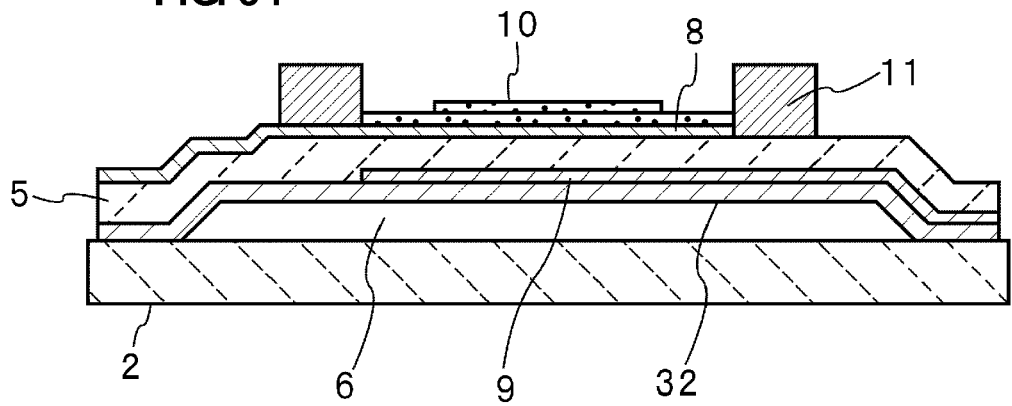
FIG. 34 is a schematic side cross-sectional view of the modified example illustrated in FIG. 34.

FIGS. 33 and 34 are a schematic partial front view and a side cross-sectional view that illustrate a piezoelectric resonator according to another modified example of a preferred embodiment of the present invention. For the piezoelectric resonator according to the modified example illustrated in FIG. 33, the film thickness and material of each of the frequency adjustment film, the mass adding film, the upper electrode, the piezoelectric thin film, and the lower electrode are configured as shown in Table 5 below. That is, the piezoelectric thin film is made of AlN and has a thickness of about 1135 nm, whereas each of the upper electrode 8 and the lower electrode 9 include a laminated metallic film shown in Table 5 below and having a relatively large thickness. Forming the piezoelectric thin film made of such a thin AlN film further reduces the thickness of the piezoelectric resonator.

TABLE 5

| Film Thickness (nm) | Resonator A |
| --- | --- |
| Frequency Adjustment Film $SiO_2$ | 20 + 80 (100 nm with the outer-edge portion being thinned by 20 nm) |

TABLE 5-continued

| Film Thickness (nm) | Resonator A |
| --- | --- |
| Adding Film AlN | 900 |
| Upper Electrode (Ti/Pt/Au/Pt/Ti) | 10/10/80/70/10 |
| AlN | 1135 |
| Lower Electrode (Ti/Pt/Au/Pt/Ti) | 10/70/80/10/10 |
| SiO$_2$ | 100 |

Figure 35:
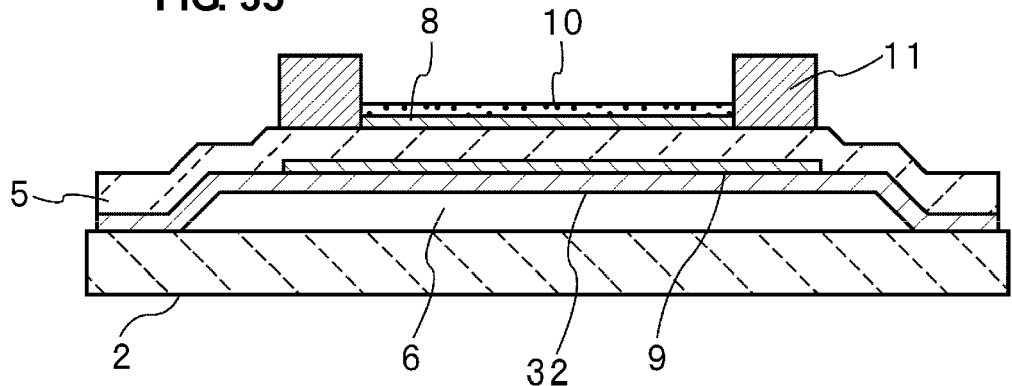
FIG. 35 is a schematic front cross-sectional view of a piezoelectric resonator according to another modified example of a preferred embodiment of the present invention.
Figure 36:
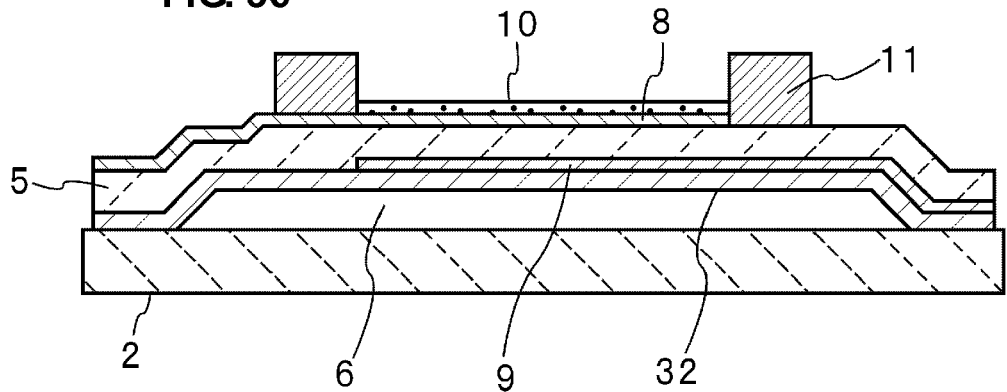
FIG. 36 is a schematic side cross-sectional view of the modified example illustrated in FIG. 35.
Figure 37:
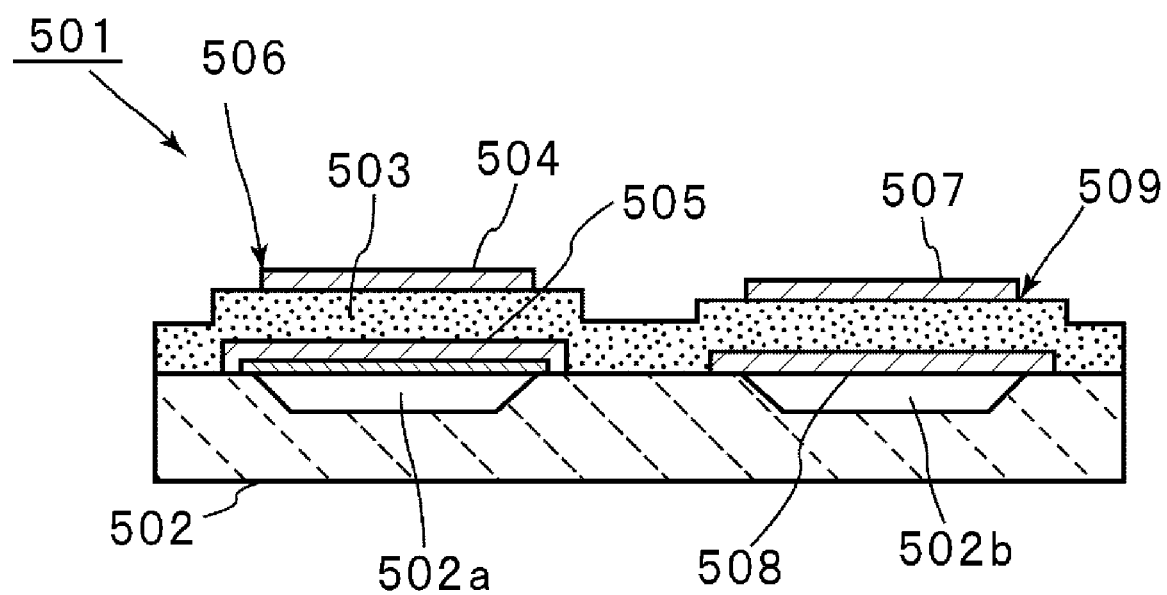
FIG. 37 is a schematic front cross-sectional view of one example of a piezoelectric filter in the related art.

FIGS. 35 and 36 illustrate a piezoelectric resonator according to still another modified example of the modified example illustrated in FIGS. 33 and 34. Here, in contrast to FIGS. 33 and 34, the SiO$_2$ film defining the frequency adjustment film includes a single layer, which does not include any steps. That is, as illustrated in Table 5, for the configuration illustrated in FIGS. 33 and 34, after the SiO$_2$ film having a thickness of about 100 nm was formed, the outer-edge portion was thinned by about 20 nm such that a step was provided for the frequency adjustment film. In contrast, as illustrated in FIGS. 35 and 36, the frequency adjustment film may include no step by forming the SiO$_2$ film so as to have a thickness of about 100 nm. The piezoelectric resonator illustrated in FIGS. 35 and 36 is formed using the same parameters shown in Table 5 as the material and thickness, except for the frequency adjustment film. Because the piezoelectric thin film is thin, the thickness of the piezoelectric resonator can be further reduced. Additionally, because it is not necessary to reduce the thickness of the outer edge of the SiO$_2$ film so as to define the frequency adjustment film, the process can be simplified so as the reduce cost.

Note that a method of making a piezoelectric resonator is not limited to the above-described method.

Figure 18:
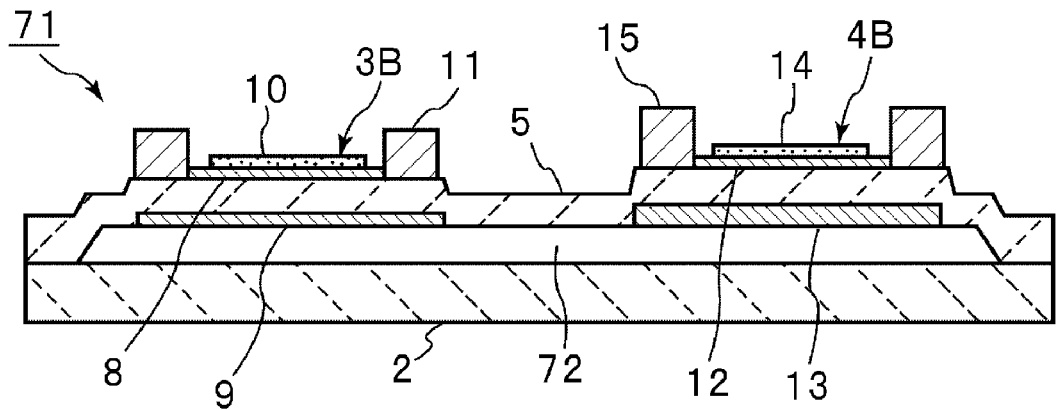
FIG. 18 is a schematic front cross-sectional view of a piezoelectric filter according to a second preferred embodiment of the present invention.

FIG. 18 is a schematic front cross-sectional view of a piezoelectric filter according to a second preferred embodiment of the present invention. For a piezoelectric filter 71 according to the second preferred embodiment, piezoelectric resonators 3B and 4B are formed using the same substrate 2. The piezoelectric filter 71 differs from the piezoelectric filter 1 according to the first preferred embodiment in that the cavities, 6 and 7 in the first preferred embodiment, are connected together. That is, the piezoelectric thin film 5 is disposed over the entire region in which the piezoelectric resonators 3B and 4B are arranged, with a cavity 72 disposed therebetween. In this manner, the plurality of piezoelectric resonators 3B and 4B may be spaced apart from the substrate 2 with the common cavity 72 disposed therebetween. The remaining configuration of the piezoelectric filter 71 is substantially the same as in the piezoelectric filter 1.

Figure 19:
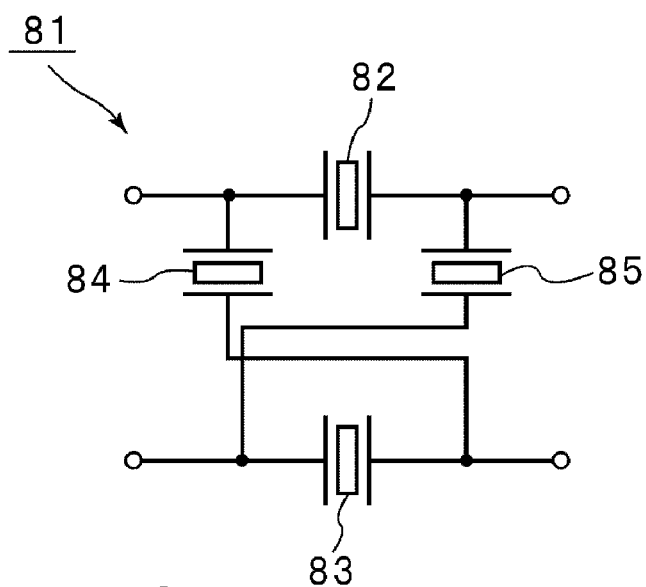
FIG. 19 is a circuit diagram that illustrates a lattice circuit as one example of circuit configuration of a piezoelectric filter to which preferred embodiments of the present invention is applied.

In the first preferred embodiment, the piezoelectric resonators 3 and 4 being electrically connected to each other to define a ladder circuit are described. In a filter device according to preferred embodiments of the present invention, the plurality of piezoelectric resonators can be electrically connected to define various filter circuits. One such example of a filter circuit is illustrated in FIG. 19. FIG. 19 is a circuit diagram of a filter device having a lattice circuit configuration.

A lattice filter 81 can be connected to other lattice filters 81. This can improves the steepness of the filter characteristics and attenuation characteristics.

Figure 20:
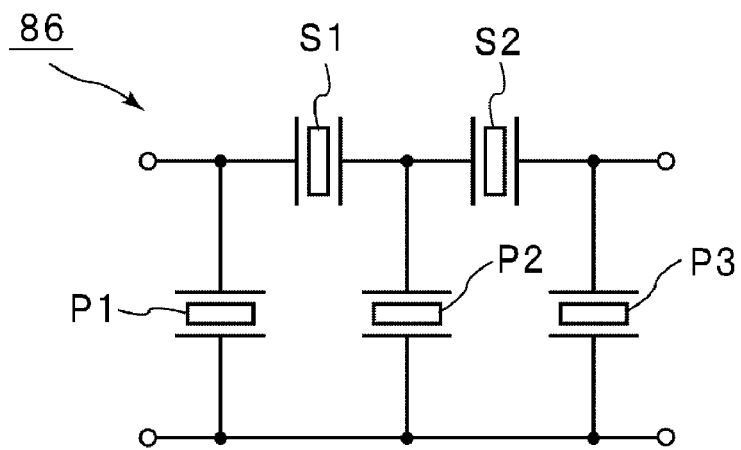
FIG. 20 is a circuit diagram that illustrates a ladder circuit as one example of circuit configuration of a piezoelectric filter to which preferred embodiments of the present invention is applied.

FIG. 20 shows a circuit diagram of a ladder filter circuit as another example of a suitable filter circuit.

Figure 21:
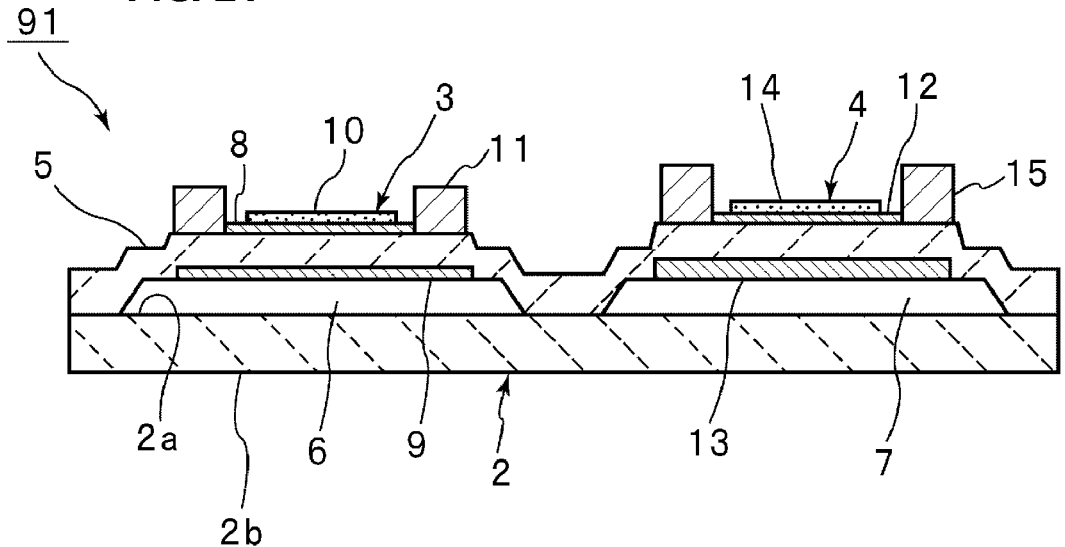
FIG. 21 is a schematic front cross-sectional view of a piezoelectric filter according to a third preferred embodiment of the present invention.

FIG. 21 is a schematic front cross-sectional view of a piezoelectric filter according to a third preferred embodiment of the present invention. A piezoelectric filter 91 has substantially the same configuration as the piezoelectric filter 1. Therefore, the same reference numerals used to denote the elements of the piezoelectric filter 1 are used to denote similar elements in FIG. 21 and the detailed description thereof is omitted. For the piezoelectric filter 91, the material and the film thickness of each of the piezoelectric resonators 3 and 4 are selected shown in Table 6 below.

TABLE 6

| Film Thickness (nm) | Resonator 3 | Resonator 4 |
| --- | --- | --- |
| Frequency Adjustment Film SiO$_2$ | 20 | 20 |
| Mass Adding Film SiO$_2$ | 320 | 320 |
| Upper Electrode (Al/Ti) | 100/10 | 100/10 |
| Piezoelectric Thin Film (AlN) | 2140 | 2140 |
| Lower Electrode (Pt/Ti) | 100/10 | 121/10 |

The resonant frequency of the piezoelectric resonator 3 is set at about 1882 MHz and the anti-resonant frequency thereof is set at about 1936 MHz. The resonant frequency of the piezoelectric resonator 4 is set at about 1821 MHz and the anti-resonant frequency thereof is set at about 1873 MHz.

Figure 22A:
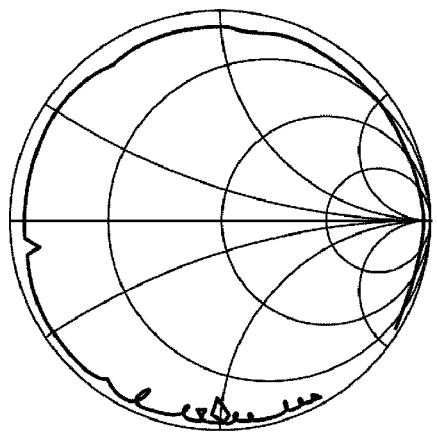
FIGS. 22A and 22B are impedance Smith charts that illustrate resonant characteristics of one piezoelectric resonator and those of the other piezoelectric resonator of the piezoelectric filter according to the third preferred embodiment, respectively.
Figure 22B:
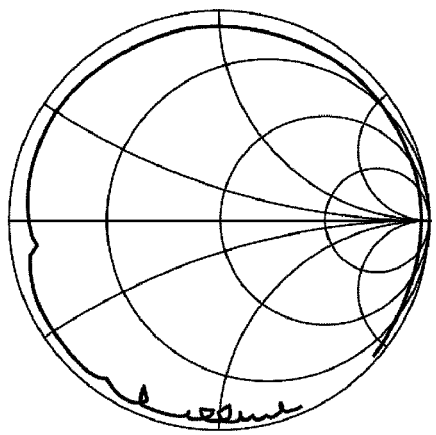

The resonant characteristics of the piezoelectric resonator 3 and those of the piezoelectric resonator 4 in the piezoelectric filter 91 according to the third preferred embodiment are shown in FIGS. 22A and 22B using Smith charts.

As shown in FIGS. 22A and 22B, a spurious component can be effectively suppressed in a range greater than the resonant frequency.

In the present preferred embodiment, because the lower electrodes 9 and 13 are made with an electrode material that has an increased density, as compared to the first preferred embodiment, the area of the piezoelectric vibrating portion can be reduced by about 16%, which enables miniaturization.

Figure 23:
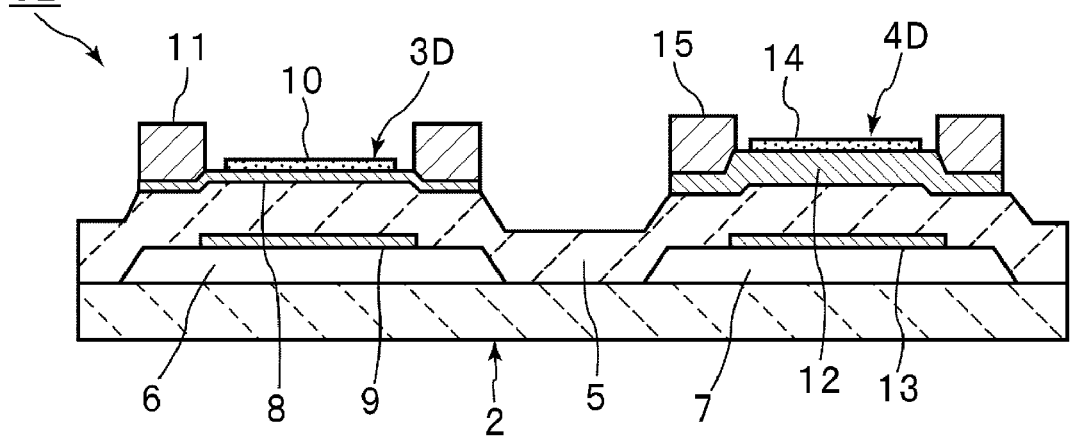
FIG. 23 is a schematic front cross-sectional view of a piezoelectric filter according to another modified example of a preferred embodiment of the present invention.

FIG. 23 is a schematic front cross-sectional view of a piezoelectric filter according to a fourth preferred embodiment of the present invention. As illustrated in FIG. 23, for a piezoelectric filter 92 according to the present preferred embodiment, in piezoelectric resonators 3D and 4D, the upper electrodes 8 and 12 extend beyond the respective piezoelectric vibrating portions to regions that overlap the mass adding films 11 and 15, respectively. In the piezoelectric resonator 4D, the upper electrode 12 is thicker than the lower electrode 13. The lower electrodes 9 and 13 are arranged in the respective piezoelectric vibrating portions and are smaller than the upper electrodes 8 and 12.

That is, in the piezoelectric filter 71 according to the present preferred embodiment, the second electrode having a larger size corresponds to the upper electrodes 8 and 12, whereas the first electrode having a smaller size corresponds to the lower electrodes 9 and 13.

As described above, in various preferred embodiments of the present invention, each of the electrodes disposed on the upper surface of the piezoelectric thin film and the electrode disposed on the lower surface thereof may be the first electrode or the second electrode.

Also in the piezoelectric filter 71, because the upper electrodes 8 and 12 defining the second electrode extend outside of the respective piezoelectric vibrating portions, and the upper electrode 12 has a greater thickness in the piezoelectric resonator 4D, a sufficient mass adding function is obtained and an undesired spurious component occurring in a range greater than the resonant frequency can be effectively suppressed, as in the first preferred embodiment.

Figure 24:
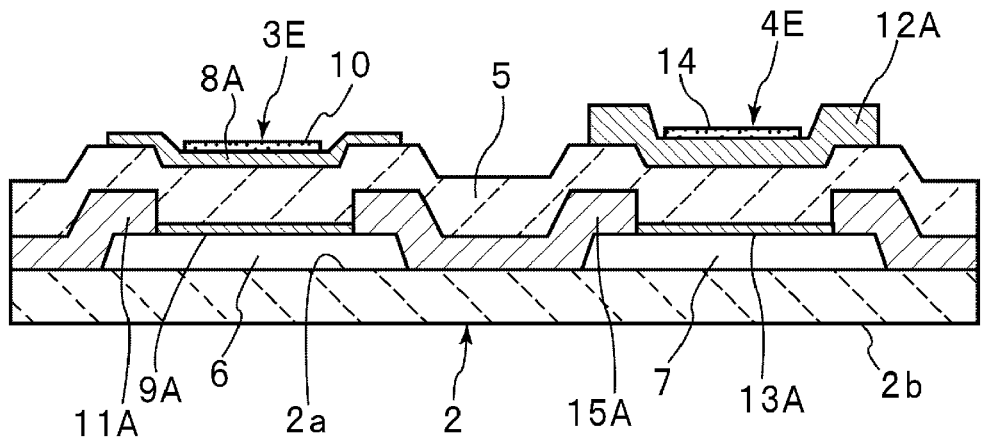
FIG. 24 is a schematic front cross-sectional view of a piezoelectric filter according to another modified example of a preferred embodiment of the present invention.

FIG. 24 is a schematic cross-sectional view of a piezoelectric filter according to a modified example of a preferred embodiment of the present invention. Here, piezoelectric vibrating portions 3E and 4E are arranged such that the piezoelectric thin film 5 is spaced apart from the substrate 2 with the cavities 6 and 7 disposed therebetween. It is noted that the piezoelectric thin film 5 is not directly disposed on the substrate 2 and mass adding films 11A and 15A disposed around the respective piezoelectric vibrating portions are disposed on the upper surface 2a of the substrate 2 outside the piezoelectric vibrating portions. That is, in the piezoelectric vibrating portion 3E, an upper electrode 8A defining the second electrode is disposed on the upper surface of the piezoelectric thin film 5, and a lower electrode 9A defining the first electrode and being smaller that the upper electrode 8A is disposed on the lower surface thereof. The mass adding film 11 is arranged on the lower surface of the piezoelectric thin film 5 around the piezoelectric vibrating portion. The mass adding film 11 extends from the surrounding area of the piezoelectric vibrating portion to the outer portion and is attached to the upper surface 2a of the substrate 2.

The frequency adjustment film 10 is disposed on the upper surface of the upper electrode 8A.

Similarly, in the piezoelectric resonator 4E, an upper electrode 12A defining the second electrode and being larger is disposed on the upper surface of the piezoelectric thin film 5, and the frequency adjustment film 14 is disposed on the upper electrode 12A. A lower electrode 13A defining the first electrode and being smaller is disposed on the lower surface of the piezoelectric thin film 5. The mass adding film 15A disposed around the lower electrode 13A is arranged from the surrounding area of the piezoelectric vibrating portion further to the outside thereof and linked to the mass adding film 11A.

As in the present modified example, the mass adding film may be arranged on the lower-surface side of the piezoelectric thin film included in the piezoelectric resonator. In this case, the laminated thin film including the piezoelectric thin film may be attached on the substrate 2 utilizing the mass adding film. The larger second electrode may be disposed on either of the upper surface and the lower surface.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A piezoelectric resonator comprising:
    a substrate including first and second main surfaces; and
    a laminated thin film including a first thin film portion and a second thin film portion, the first thin film portion being disposed on the first main surface of the substrate and supported by the substrate, the second thin film portion being spaced apart from the first main surface of the substrate and acoustically isolated from the substrate; wherein
    the second thin film portion of the laminated thin film includes a piezoelectric thin film, a first electrode disposed on one main surface of the piezoelectric thin film, and a second electrode disposed on another main surface of the piezoelectric thin film and being larger than the first electrode, and a portion in which the first and second electrodes overlap each other with the piezoelectric thin film disposed therebetween defines a piezoelectric vibrating portion;
    the piezoelectric resonator further comprising:
        a mass adding film disposed around the first electrode and on at least one portion of an outer region of the first electrode extending outward from a periphery of the piezoelectric vibrating portion; and
        a step forming film disposed on the first electrode and arranged within the periphery of the piezoelectric vibrating portion with a gap therebetween; wherein
    the second electrode is arranged so as to extend beyond the piezoelectric vibrating portion to a region in which the mass adding film is disposed.

2. The piezoelectric resonator according to claim 1, wherein the first electrode and the second electrode have different film thicknesses.

3. The piezoelectric resonator according to claim 2, wherein the second electrode has a film thickness greater than that of the first electrode.

4. A piezoelectric filter comprising a plurality of piezoelectric resonators according to claim 1 disposed on a common substrate, wherein the plurality of piezoelectric resonators are electrically connected together and define a filter circuit.

5. The piezoelectric filter according to claim 4, wherein at least one piezoelectric resonator of the plurality of piezoelectric resonators is different from the other piezoelectric resonators.

6. The piezoelectric filter according to claim 5, wherein the second electrode of the at least one piezoelectric resonator has a film thickness that is different from that of the second electrode of each of the other piezoelectric resonators, thereby causing a resonant frequency of the at least one piezoelectric resonator to differ from a resonant frequency of each of the other piezoelectric resonators.

7. The piezoelectric filter according to claim 5, wherein, in the at least one piezoelectric resonator of the plurality of piezoelectric resonators, the first electrode and the second electrode have different film thicknesses.

8. The piezoelectric filter according to claim 7, wherein, in the at least one piezoelectric resonator of the plurality of piezoelectric resonators, the second electrode has a film thickness greater than that of the first electrode.

* * * * *